(12) United States Patent
Carpenter et al.

(10) Patent No.: US 10,539,106 B2
(45) Date of Patent: *Jan. 21, 2020

(54) METHOD OF MAKING A FUEL INJECTOR NOZZLE

(71) Applicant: 3M INNOVATIVE PROPERTIES COMPANY, St. Paul, MN (US)

(72) Inventors: Barry S. Carpenter, Oakdale, MN (US); Jaime B. Willoughby, Hugo, MN (US); Jennifer J. Sahlin, Minneapolis, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 229 days.

This patent is subject to a terminal disclaimer.

(21) Appl. No.: 15/099,122

(22) Filed: Apr. 14, 2016

(65) Prior Publication Data

US 2016/0230731 A1 Aug. 11, 2016

Related U.S. Application Data

(63) Continuation of application No. 13/387,550, filed as application No. PCT/US2010/043628 on Jul. 29, 2010, now Pat. No. 9,333,598.

(Continued)

(51) Int. Cl.
*F02M 61/18* (2006.01)
*B23P 15/16* (2006.01)
(Continued)

(52) U.S. Cl.
CPC .......... *F02M 61/1833* (2013.01); *B05B 1/06* (2013.01); *B23P 15/16* (2013.01); *B29C 59/00* (2013.01);
(Continued)

(58) Field of Classification Search
CPC .......... B23P 15/16; B05B 1/06; B29C 59/00; F02M 61/1833; F02M 61/1806;
(Continued)

(56) References Cited

U.S. PATENT DOCUMENTS 5,127,156 A 7/1992 Yokoyama
5,453,104 A 9/1995 Schwabel
(Continued)

FOREIGN PATENT DOCUMENTS

DE 102006041472 6/2008
GB 1266201 3/1972
(Continued)

OTHER PUBLICATIONS

Nakano et al., JP2006002720, Published Jan. 5, 2006, English translation.

(Continued)

*Primary Examiner* — Sarang Afzali

(57) ABSTRACT

A method of fabricating a fuel injector nozzle comprising the steps of: (a) forming a first microstructured pattern in a first material; (b) replicating the first microstructured pattern in a second material to make a first mold comprising a second microstructured pattern in the second material; (c) replicating the second microstructured pattern in a third material to make a second mold comprising a third microstructured pattern comprising a plurality of microstructures in the third material; (d) replicating the third microstructured pattern in a metal material to make a replicated structure; and (e) removing the third material resulting in a nozzle having a plurality of through-holes through the metal material and corresponding to the plurality of microstructures in the third microstructured pattern. Each of the plurality of through-holes has a hole wall connecting a hole entry to a (Continued)

hole exit, and the hole wall of at least one through-hole has a side that curves from its hole entry to its hole exit.

12 Claims, 20 Drawing Sheets

Related U.S. Application Data

(60) Provisional application No. 61/229,821, filed on Jul. 30, 2009.

(51) Int. Cl.
| | | |
|---|---|---|
| *B05B 1/06* | (2006.01) | |
| *F02M 61/16* | (2006.01) | |
| *B29C 59/00* | (2006.01) | |
| *C23C 14/14* | (2006.01) | |
| *C23C 14/58* | (2006.01) | |
| *C25D 3/12* | (2006.01) | |
| *C25D 5/48* | (2006.01) | |
| *C25D 7/00* | (2006.01) | |

(52) U.S. Cl.
CPC ............ *C23C 14/14* (2013.01); *C23C 14/58* (2013.01); *C25D 3/12* (2013.01); *C25D 5/48* (2013.01); *C25D 7/00* (2013.01); *F02M 61/168* (2013.01); *F02M 61/184* (2013.01); *F02M 61/1806* (2013.01); *F02M 2200/8069* (2013.01); *Y10T 29/49432* (2015.01); *Y10T 29/49433* (2015.01)

(58) Field of Classification Search
CPC ............ F02M 61/184; F02M 61/168; F02M 2200/8069; C23C 14/58; C23C 14/14; C25D 7/00; C25D 5/48; C25D 3/12; Y10T 29/49433; Y10T 29/49432
See application file for complete search history.

(56) References Cited

U.S. PATENT DOCUMENTS

| | | | |
|---|---|---|---|
| 5,622,611 A | | 4/1997 | Marks |
| 5,636,796 A | | 6/1997 | Oguma |
| 5,685,485 A | | 11/1997 | Mock |
| 5,685,491 A | * | 11/1997 | Marks ................. F02M 61/168 205/70 |
| 5,716,009 A | | 2/1998 | Ogihara |
| 5,899,390 A | | 5/1999 | Arndt et al. |
| 5,924,634 A | * | 7/1999 | Arndt ................. B05B 1/34 239/533.12 |
| 6,387,981 B1 | | 5/2002 | Zhang |
| 6,572,693 B1 | | 6/2003 | Wu |
| 6,764,924 B2 | | 7/2004 | Gmür |
| 6,826,833 B1 | | 12/2004 | Maier |
| 6,899,948 B2 | | 5/2005 | Zhang |
| 6,980,855 B2 | | 12/2005 | Cho |
| 7,128,282 B2 | | 10/2006 | Okamoto et al. |
| 7,159,802 B2 | | 1/2007 | Oomura |
| 7,297,374 B1 | | 11/2007 | Arney |
| 7,393,882 B2 | | 7/2008 | Wu |
| 7,582,685 B2 | | 9/2009 | Arney |
| 7,583,444 B1 | | 9/2009 | DeVoe |
| 7,936,956 B2 | | 5/2011 | Marttila |
| 8,215,572 B2 | | 7/2012 | Vogel |
| 8,226,018 B2 | | 7/2012 | Magel |
| 8,544,770 B2 | | 10/2013 | Limmer et al. |
| 8,858,807 B2 | | 10/2014 | DeVoe |
| 2008/0105767 A1 | | 5/2008 | Fujii et al. |
| 2008/0187472 A1 | * | 8/2008 | Ahn ................. B01F 5/0403 422/255 |
| 2009/0099537 A1 | | 4/2009 | DeVoe |
| 2009/0175050 A1 | | 7/2009 | Marttila |
| 2009/0308953 A1 | | 12/2009 | Palestrant |
| 2010/0227272 A1 | | 9/2010 | DeVoe |

FOREIGN PATENT DOCUMENTS

| | | |
|---|---|---|
| JP | H0681750 | 3/1994 |
| JP | H11117833 | 4/1999 |
| JP | 2002-115627 | 4/2002 |
| JP | 2002-258490 | 9/2002 |
| JP | 2003227445 | 8/2003 |
| JP | 2005-131539 | 5/2005 |
| JP | 2005-250021 | 9/2005 |
| JP | 2005-315136 | 11/2005 |
| JP | 2006002720 | 1/2006 |
| JP | 2006035602 | 2/2006 |
| JP | 2006125273 | 5/2006 |
| JP | 2006-150343 | 6/2006 |
| JP | 2007160523 | 6/2007 |
| JP | 2007-263114 | 10/2007 |
| JP | 2009085041 | 4/2009 |
| JP | 2010-216412 | 9/2010 |
| WO | WO 99/51872 | 10/1999 |

OTHER PUBLICATIONS

Trausch, "New photolithographic production of structures for the manufacturing of precision flat work pieces with the electroplating procedure," Siemens research and development report, vol. 8 (1979) No. 6, pp. 347-351.

* cited by examiner

METHOD OF MAKING A FUEL INJECTOR NOZZLE

CROSS REFERENCE TO RELATED APPLICATIONS

This application is a continuation of U.S. application Ser. No. 13/387,550, filed Jan. 27, 2012, now granted as U.S. Pat. No. 9,333,598, which is a 371 of International Application No. PCT/US2010/043628, filed Jul. 29, 2010, which claims benefit of provisional 61/229,821, filed Jul. 30, 2009, the disclosures of which are incorporated by reference in their entireties herein.

FIELD OF THE INVENTION

This invention generally relates to nozzles. The invention is further applicable to fuel injectors incorporating such nozzles.

BACKGROUND

Fuel injection is increasingly becoming the preferred method for mixing fuel and air in internal combustion engines. Fuel injection generally can be used to increase fuel efficiency of the engine and reduces hazardous emissions. Fuel injectors generally include a nozzle for atomizing the fuel under pressure for combustion. Increasing stringent environmental standards require more efficient fuel injectors.

SUMMARY OF THE INVENTION

Generally, the present invention relates to nozzles and methods of making nozzles. In one embodiment, a method of fabricating a nozzle includes the steps of: (a) providing a first material that is capable of undergoing multiphoton reaction; (b) forming a first microstructured pattern in the first material using a multiphoton process; (c) replicating the first microstructured pattern in a second material different than the first material to make a first mold that includes a second microstructured pattern in the second material; (d) replicating the second microstructured pattern in a third material that is different than the first and second materials to make a second mold that includes a third microstructured pattern that includes a plurality of microstructures in the third material; (e) planarizing the third microstructured pattern of the second mold with a layer of a fourth material that is different than the third material, where the layer exposes the tops of the microstructures in the plurality of microstructures in the third microstructured pattern; and (f) removing the third material resulting in a nozzle that has a plurality of holes in the fourth material, where the holes correspond to the plurality of microstructures in the third microstructured pattern. In some cases, the steps in the method are carried sequentially. In some cases, the first material includes poly(methyl methacrylate). In some cases, the first material is capable of undergoing a two photon reaction. In some cases, the first microstructured pattern includes a plurality of discrete microstructures. In some cases, the plurality of discrete microstructures includes a discrete microstructure that is a three-dimensional rectilinear body, a portion of a three-dimensional rectilinear body, a three-dimensional curvilinear body, a portion of a three-dimensional curvilinear body, a polyhedron, a cone, a tapered microstructure, or a spiraling microstructure. In some cases, the first microstructured pattern is formed in the first material using a two photon process. In some cases, the step of forming the first microstructured pattern in the first material includes exposing at least a portion of the first material to cause a simultaneous absorption of multiple photons. In some cases, the step of forming the first microstructured pattern in the first material includes removing the exposed portions of the first material, or the unexposed portions of the first material. In some cases, replicating the first microstructured pattern in the second material includes electroplating the first microstructured pattern. In some cases, the second material comprises an electroplating material. In some cases, the first mold comprises a metal. In some cases, the first mold comprises Ni. In some cases, the second microstructured pattern is substantially a negative replica of the first microstructured pattern. In some cases, the step of replicating the second microstructured pattern in the third material includes injection molding. In some cases, the third material includes a polymer, such as polycarbonate. In some cases, the second mold includes a polymer. In some cases, the third microstructured pattern is substantially a negative replica of the second microstructured pattern. In some cases, the step of planarizing the third microstructured pattern includes electroplating the third microstructured pattern. In some cases, the step of planarizing the third microstructured pattern includes coating the third microstructured pattern with the fourth material. In some cases, the step of planarizing the third microstructured pattern includes electroplating the third microstructured pattern with the fourth material. In some cases, the step of planarizing the third microstructured pattern includes removing a portion of the fourth material, where, in some cases, the portion of the coated fourth material is removed by a grinding method. In some cases, the fourth material includes an electroplating material. In some cases, the nozzle includes a metal. In some cases, the nozzle includes Ni.

In another embodiment, a nozzle includes a hollow interior and at least one hole that connects the hollow interior with an outside of the nozzle. The at least one hole includes a hole entry at the hollow interior of the nozzle having a first shape, and a hole exit at the outside of the nozzle having a second shape that is different than the first shape. In some cases, the first shape is an elliptical shape and the second shape is a circular shape. In some cases, the first shape is a racetrack shape and the second shape is a circular shape. In some cases, the perimeter of the first shape includes the outer arcs of a plurality of closely packed circles, where the outer arcs are connected by curve-like fillets.

In another embodiment, a nozzle includes a hollow interior and at least one hole that connects the hollow interior with an outside of the nozzle. The at least one hole includes a hole entry at the hollow interior of the nozzle and a hole exit at the outside of the nozzle. The at least one hole has a cross-section that rotates from the hole entry to the hole exit. In some cases, the cross-section has an increasing rotation rate from the hole entry to the hole exit. In some cases, the cross-section has a decreasing rotation rate from the hole entry to the hole exit. In some cases, the cross-section has a constant rotation rate from the hole entry to the hole exit. In some cases, the hole entry has a first shape and the hole exit has a second shape that is different than the first shape. In some cases, the nozzle includes a plurality of holes that are arranged in an array of concentric circles that includes an outermost circle. The discrete nozzle holes are arranged such that no diameter of the outermost circle includes at lease one discrete nozzle hole from each circle in the array of concentric circles. In some cases, each circle in the array of concentric circles includes equally spaced discrete nozzle holes.

BRIEF DESCRIPTION OF DRAWINGS

The invention may be more completely understood and appreciated in consideration of the following detailed description of various embodiments of the invention in connection with the accompanying drawings, in which.

In the specification, a same reference numeral used in multiple figures refers to the same or similar elements having the same or similar properties and functionalities.

DETAILED DESCRIPTION

Figure 1A:
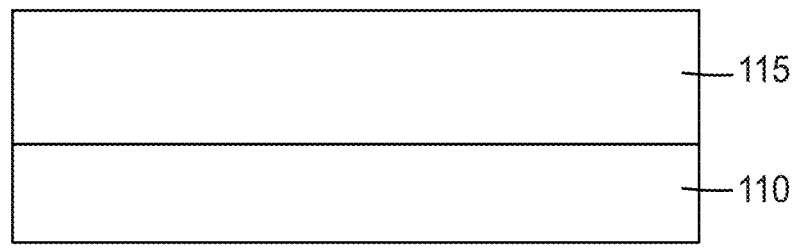
FIGS. 1A-1M are schematic representations of constructions at intermediate stages or steps in a process for fabricating a nozzle.

This invention generally relates to spray nozzles. The disclosed nozzles include one or more holes designed to improve spray direction and fluid dynamics at the hole inlet, within the hole wall, and at the hole outlet. The disclosed nozzles can advantageously be incorporated into fuel injector systems to improve fuel efficiency. The disclosed nozzles can be fabricated using multiphoton, such as two photon, processes. In particular, multiphoton processes can be used to fabricate microstructures that can, in turn, be used as molds to fabricate holes for use in nozzles or other applications.

It should be understood that the term "nozzle" may have a number of different meanings in the art. In some specific references, the term nozzle has a broad definition. For example, U.S. Patent Publication No. 2009/0308953 A1 (Palestrant et al.), discloses an "atomizing nozzle" which includes a number of elements, including an occluder chamber 50. This differs from the understanding and definition of nozzle put forth herewith. For example, the nozzle of the current description would correspond generally to the orifice insert 24 of Palestrant et al. In general, the nozzle of the current description can be understood as the final tapered portion of an atomizing spray system from which the spray is ultimately emitted, see e.g., Merriam Webster's dictionary definition of nozzle ("a short tube with a taper or constriction used (as on a hose) to speed up or direct a flow of fluid." Further understanding may be gained by reference to U.S. Pat. No. 5,716,009 (Ogihara et al.) issued to Nippondenso Co., Ltd. (Kariya, Japan). In this reference, again, fluid injection "nozzle" is defined broadly as the multi-piece valve element 10 ("fuel injection valve 10 acting as fluid injection nozzle . . . "—see col. 4, lines 26-27 of Ogihara et al.). The current definition and understanding of the term "nozzle" as used herein would relate to first and second orifice plates 130 and 132 and potentially sleeve 138 (see FIGS. 14 and 15 of Ogihara et al.), for example, which are located immediately proximate the fuel spray. A similar understanding of the term "nozzle" to that described herein is used in U.S. Pat. No. 5,127,156 (Yokoyama et al.) to Hitachi, Ltd. (Ibarak$_1$, Japan). There, the nozzle 10 is defined separately from elements of the attached and integrated structure, such as "swirler" 12 (see FIG. 1(II)). The above-defined understanding should be understood when the term "nozzle" is referred to throughout the remainder of the description and claims.

Figure 2:
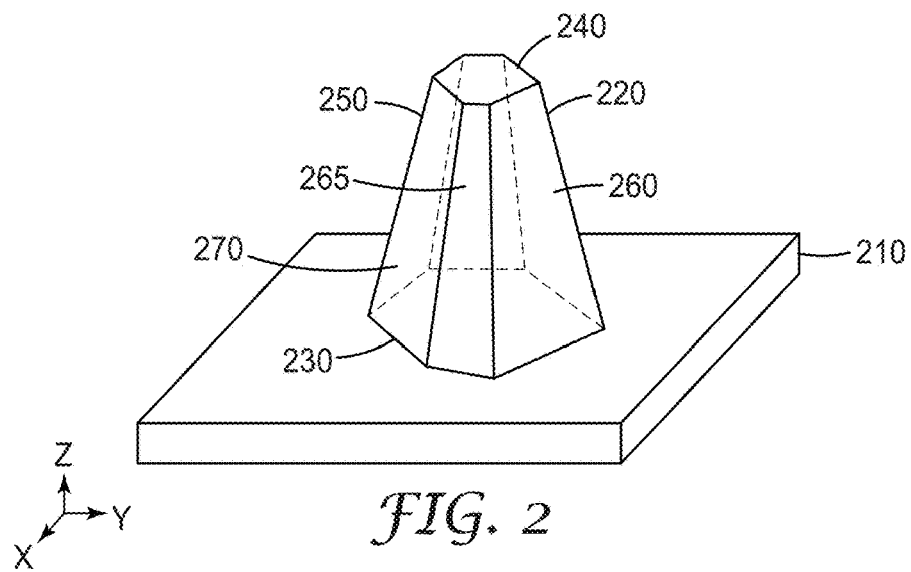
FIG. 2 is a schematic three-dimensional view of a microstructure.

In some cases, a disclosed microstructure can be a three-dimensional rectilinear body such as a polyhedron, such as a tetrahedron or a hexahedron, a prism, or a pyramid, or a portion, or a combination, of such bodies, such as a frustum. For example, FIG. 2 is a schematic three-dimensional view of a microstructure 220 that is disposed on a substrate 210 and includes a planar or flat base 230, a planar or flat top 240 and a side 250 that connects the top to the base. Side 250 includes a plurality of planar or flat facets, such as facets 260, 265 and 270. Microstructure 220 can be used as a mold to fabricate holes for use in, for example, a nozzle.

Figure 3:
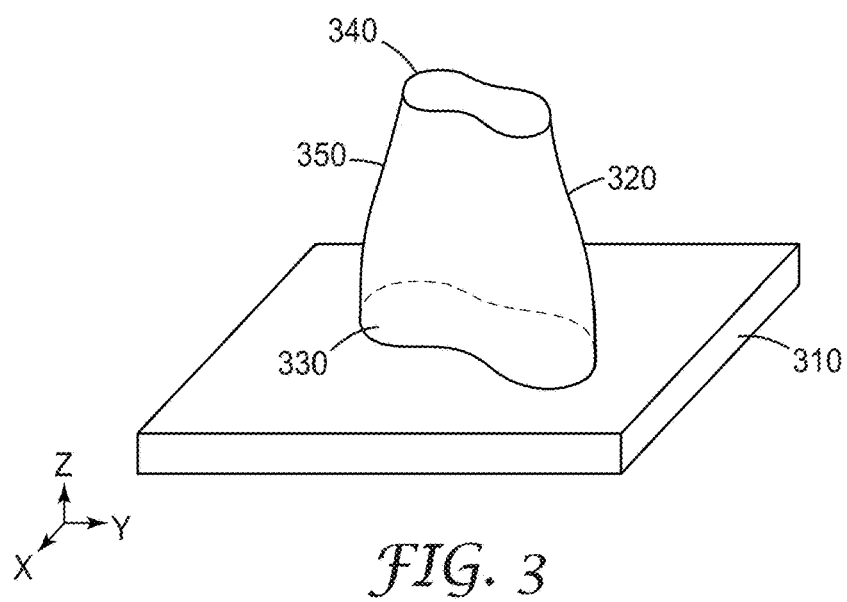
FIG. 3 is a schematic three-dimensional view of another microstructure.

In some cases, a disclosed microstructure can be a three-dimensional curvilinear body or a portion of such body, such as a segment of a sphere, an asphere, an ellipsoid, a spheroid, a paraboloid, a cone or a truncated cone, or a cylinder. For example, FIG. 3 is a schematic three-dimensional view of a microstructure 320 that is disposed on a substrate 310 and includes a planar or flat base 330, a planar or flat top 340 and a curvilinear side 350 that connects the top to the base. In the exemplary microstructure 320, top 340 and base 330 have the same shape. Microstructure 320 tapers narrower from base 330 to top 340. As a result, top 340 has a smaller area than base 330. Microstructure 320 can be used as a mold to fabricate holes for use in, for example, a nozzle.

Figure 4:
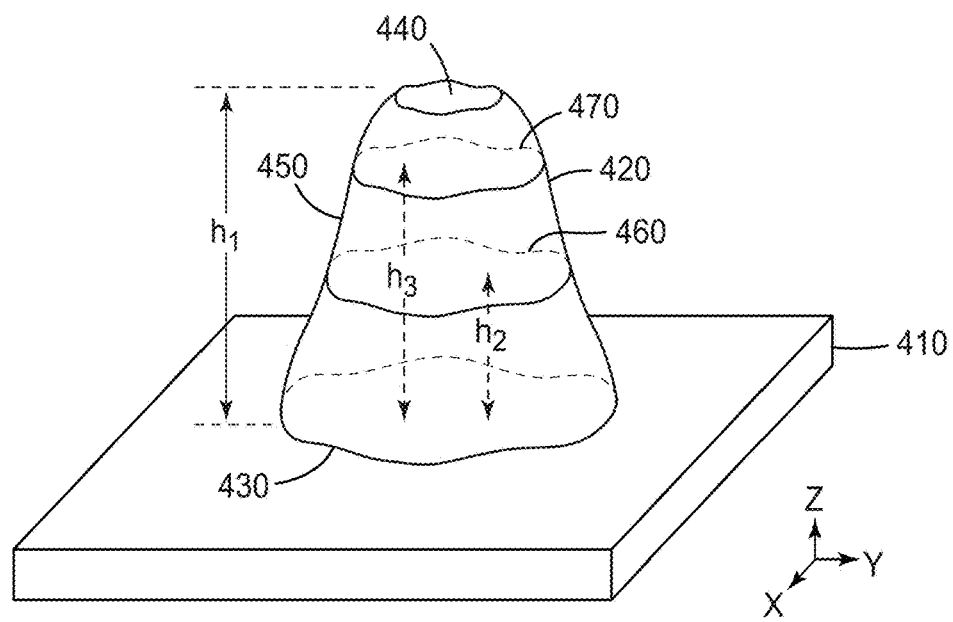
FIG. 4 is a schematic three-dimensional view of another microstructure.

In some cases, some of the characteristics of a disclosed microstructure changes from the base to the top. For example, in some cases, a disclosed microstructure can be a tapered microstructure. For example, FIG. 4 is a schematic three-dimensional view of a microstructure 420 that can be fabricated using a multiphoton process. Microstructure 420 can be used as a mold to fabricate holes for use in, for example, a nozzle. Microstructure 420 is disposed on a substrate 410 and includes a base 430, a top 440, and a side 450 connecting the top to the base. Microstructure 420 has a height or thickness $h_1$ which is the distance between base 430 and top 440 along the z-axis. Microstructure 420 is tapered. In particular, the cross-sectional area of the microstructure along the thickness of the microstructure decreases from base 430 to top 440. For example, microstructure 420 includes a cross-section 460 at height $h_2$ in the xy-plane and a cross-section 470 at height $h_3>h_2$ in the xy-plane. The area of cross-section 470 is less than the area of cross-section 460, and the area of cross-section 460 is less than the area of base 430.

Figure 5:
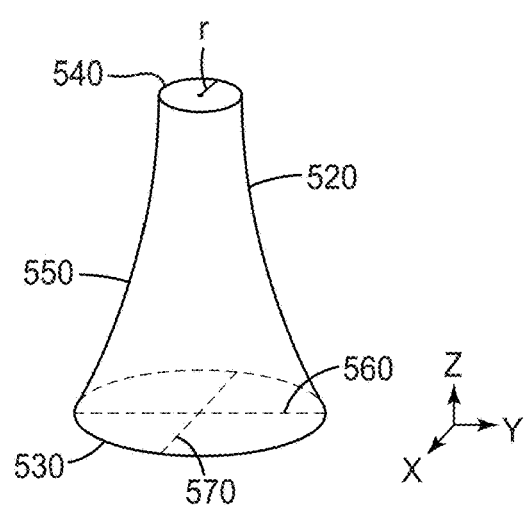
FIG. 5 is a schematic three-dimensional view of another microstructure.

Base 430 has a first shape and top 440 has a second shape that is different than the first shape. In some cases, the first shape is an elliptical shape and the second shape is a circular shape. For example, FIG. 5 is a schematic three-dimensional view of a microstructure 520 that includes an elliptical base 530, a circular top 540, and a side 550 that connects the top to the base. Elliptical base 530 has a major axis 560 along the y-direction having a length "a" and a minor axis 570 along the x-direction having a length "b" different than "a". Circular top 540 has a radius r. Microstructure 520 is tapered. In particular, the area of circular top 540 is less than the area of elliptical base 530.

Figure 6:
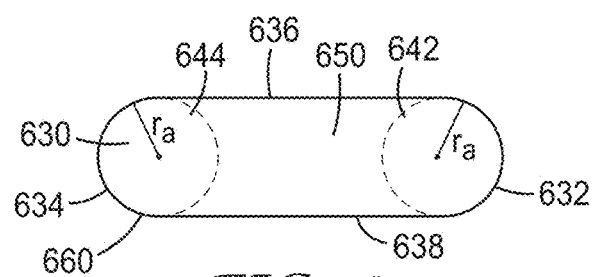
FIG. 6 is a schematic of a base of a microstructure.

As another example, the first shape can be a racetrack and the second shape can, for example, be a circle. For example, FIG. 6 is a schematic of a base 630 that can be the base of a disclosed microstructure. Base 630 includes two circles 642 and 644 and a middle portion 650. Base 630 has a perimeter 660 that includes curved portions or arcs 632 and 634 and linear portions 636 and 638. Curved portions 632 and 634 are portions of respective circles 642 and 644.

Figure 7:
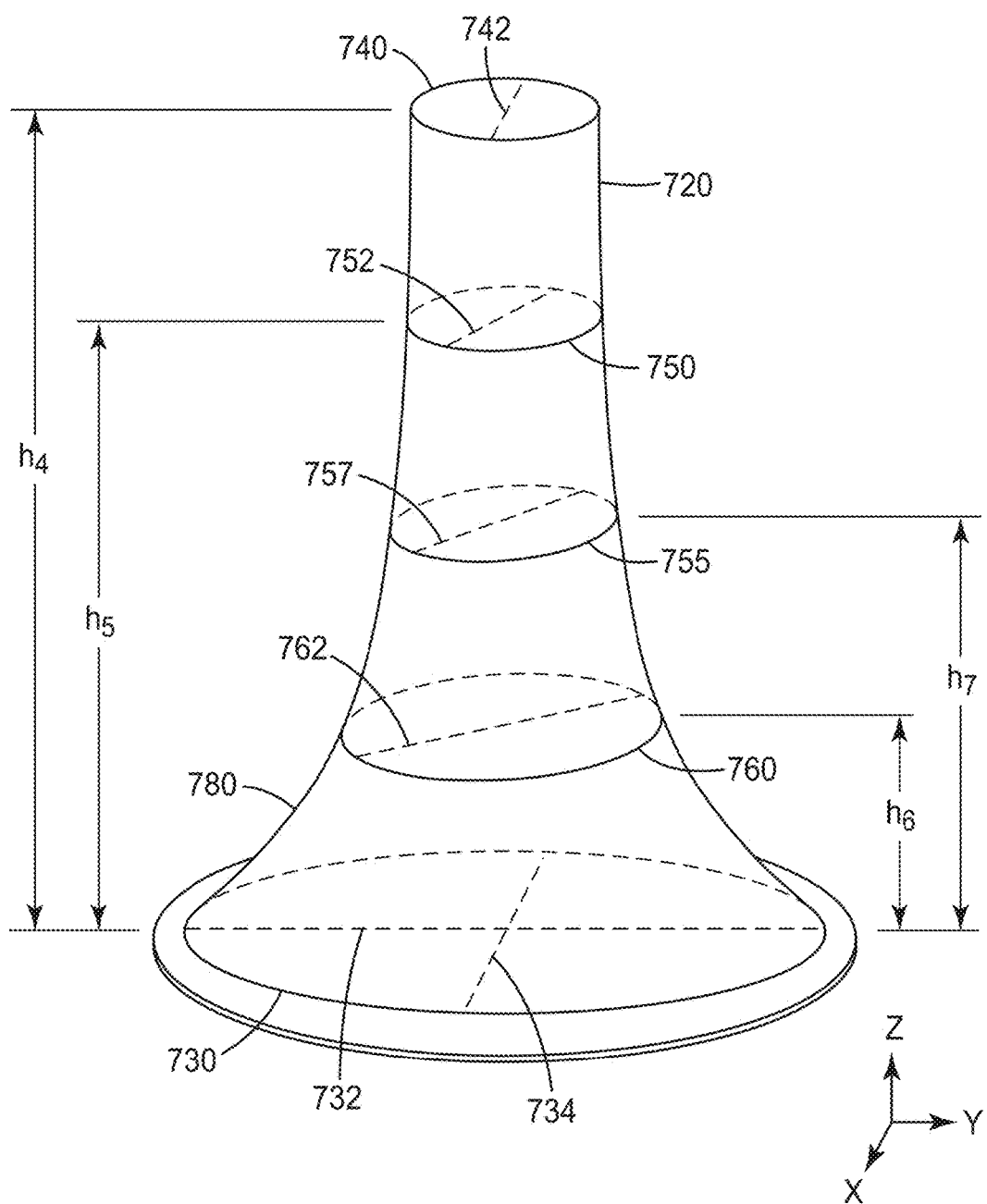
FIGS. 7 and 8 are respective schematic three-dimensional and top views of a microstructure.
Figure 8:
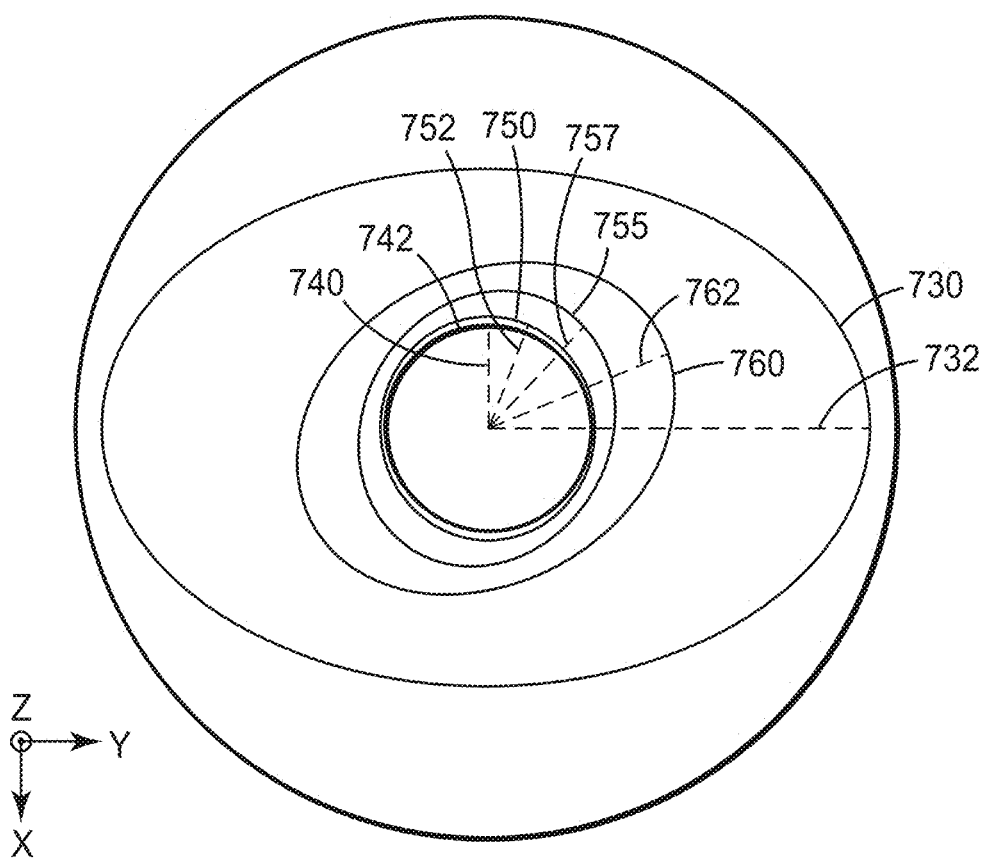

In some cases, a disclosed microstructure has a cross-section along the thickness or height direction of the microstructure that rotates from the base of the microstructure to the top of the microstructure. For example, FIG. 7 is a schematic three-dimensional view of a microstructure 720 that includes a base 730 disposed in the xy-plane, a top 740 disposed in the xy-plane, and a side 780 that connects the top to the base. Microstructure 720 has a height $h_4$. Microstructure 720 has an xy cross-section that rotates clockwise from top 740 to base 730. In particular, top 740 has an axis of symmetry 742 along the x-direction, an xy cross-section 750 of the microstructure at a height $h_5<h_4$ has an axis of symmetry 752 that is rotated clockwise relative to axis of symmetry 742, an xy cross-section 755 of the microstructure at a height $h_6<h_5$ has an axis of symmetry 757 that is rotated clockwise relative to axis of symmetry 752, an xy cross-section 760 of the microstructure at height a $h_7<h_6$ has an axis of symmetry 762 that is rotated clockwise relative to axis of symmetry 757, and base 730 has an axis of symmetry 732 along the y-axis that is rotated clockwise relative to axis of symmetry 762. Equivalently, microstructure 720 has an xy cross-section that rotates counter clockwise from base 730 to top 740. FIG. 8 is a schematic top-view of microstructure 720 illustrating top 740 and its axis of symmetry 742, cross-section 750 and its axis of symmetry 752, cross-section 755 and its axis of symmetry 757, cross-section 760 and its axis of symmetry 762, and base 730 and its axis of symmetry 732. Viewed from the top, the axes of symmetry of the cross-sections rotate clockwise from the top to the base. Such a rotation results in a twist in the microstructure along its height or thickness. In some cases, each cross-section can be an ellipse with a corresponding major axis acting as an axis of symmetry. In such cases, the major axis rotates from the base to the top. In some cases, such as when the microstructure is tapered and twisted, the cross-sections rotate and become smaller from the base to the top. For example, an elliptical base 730 has a major axis 732 along the y-direction having a length "a" and a minor axis 734 along the x-direction having a length "b" different than "a". As the major axis rotates from the base to the top, the ratio a/b is reduced by, for example, decreasing "a" resulting in a smaller ellipse that eventually can become a circle at the top (a=b). In general, a disclosed microstructure can include a taper and/or a twist or spiral along the thickness of the microstructure from the base to the top.

Microstructure 720 can be used as a mold to fabricate one or more holes in a nozzle with the holes having substantially the same profile as microstructure 720. For example, the fabrication results in a hole 720 having a hole entry 730, a hole exit 740 and a wall 752 extending from the hole entry to the hole exit. The hole tapers and spirals or twists from the hole entry to the hole exit. A disclosed spiraling or twisting nozzle hole can advantageously be used in a fuel injector to enhance the flow velocity of the fuel, reduce droplet size, and improve the mixing of fuel with air.

The microstructure may be understood as having a "diameter" at different heights of the microstructure (e.g. $h_6$, $h_5$, etc.). The diameter may be understood as the maximum distance between the edges of the microstructure at a common height. In the situation, where there is an elliptical base, such as at hole entry 730, the diameter will be the distance between the edges of the microstructure along the major axis 732. At the opposite end of the structure, corresponding to hole exit 740, the diameter will similarly be the maximum distance between the edges of the microstructure at the common height (here, $h_4$). Thus, the distance between the edges of the microstructure along axis 742 will correspond to the diameter of the hole exit. In some embodiments the hole entry may have a diameter of less than 300 microns, or of less than 200 microns, or of less than or equal to 160 microns, or of less than 140 microns. In some embodiments the hole exit may have a diameter of less than 300 microns, or less than 200 microns, or less than 100 microns, or less than or equal to 40 microns, or less than 25 microns.

In some cases, the cross-section of nozzle hole 720 has an increasing rotation rate from the hole entry to the hole exit. In some cases, the cross-section of nozzle hole 720 has a decreasing rotation rate from the hole entry to the hole exit. In some cases, the cross-section has a constant rotation rate from the hole entry to the hole exit.

Figure 9:
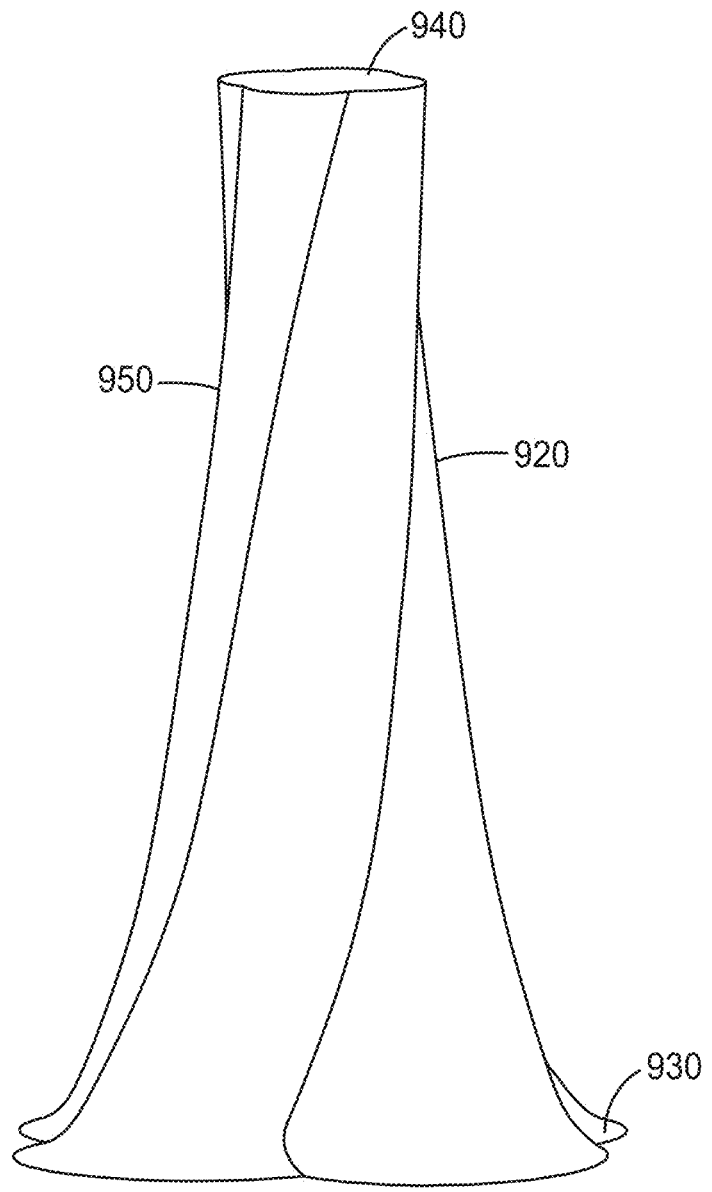
FIG. 9 is a schematic three-dimensional view of a microstructure (nozzle hole)
Figure 10:
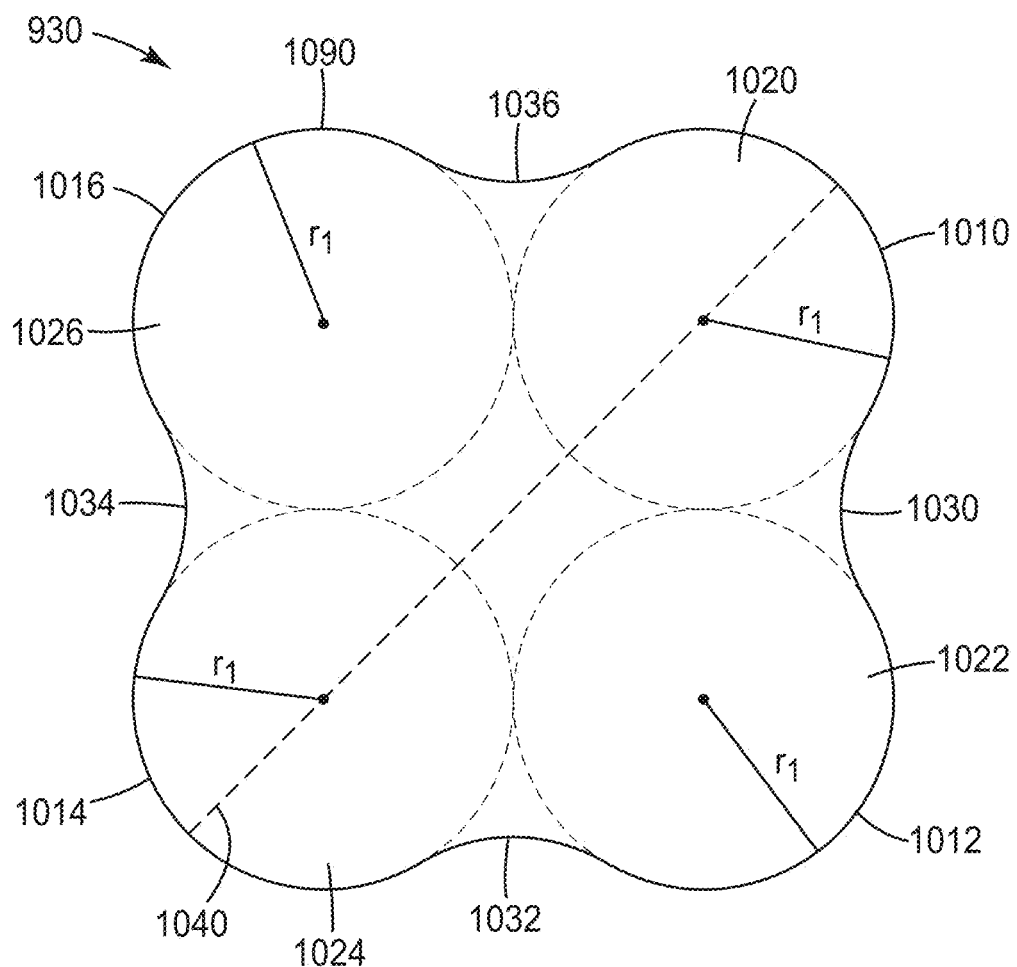
FIG. 10 is a schematic of the base (hole entry) of the microstructure (nozzle hole) shown in FIG. 9.

In general, a base or a lateral cross-section of a disclosed microstructure, or an entry hole or a lateral cross-section of a disclosed nozzle hole, can have any cross-section that may be desirable in an application. In some cases, the base or the entry hole can have a perimeter that includes the outer arcs of closely packed circles, where the outer arcs are connected by curve-like fillets. For example, FIG. 9 is a schematic three-dimensional view of a microstructure 920 that includes a base 930, a top 940, and a side 950 that connects the base to the top. FIG. 10 is a schematic of base 930 having a perimeter 1090 that includes the outer arcs of four closely packed circles, where the outer arcs are connected by curve-like fillets. In particular, perimeter 1090 includes an outer arc 1010 of a circle 1020, an outer arc 1012 of a circle 1022, an outer arc 1011 of a circle 1024, and an outer arc 1016 of a circle 1026, where outer arcs 1010 and 1012 are connected by curve-like fillet 1030, outer arcs 1012 and 1014 are connected by curve-like fillet 1032, outer arcs 1014 and 1016 are connected by curve-like fillet 1034, and outer arcs 1016 and 1010 are connected by curve-like fillet 1036.

Circles 1010, 1012, 1014 and 1016 form a square array of equal and touching circles where each circle has a radius $r_1$.

Base 930 includes an axis of symmetry 1040. The lateral cross-sections of microstructure 920 rotate and the radius $r_1$ decreases from base 930 to top 940 resulting in a microstructure that spirals and tapers narrower from base 930 to top 940.

Equivalently, a nozzle hole 920 includes a hole entry 930, a hole exit 940 and a wall 950 extending from the hole entry to the hole exit. Hole 920 has a lateral cross-section that rotates and becomes smaller from the hole entry to the hole exit.

Figure 11:
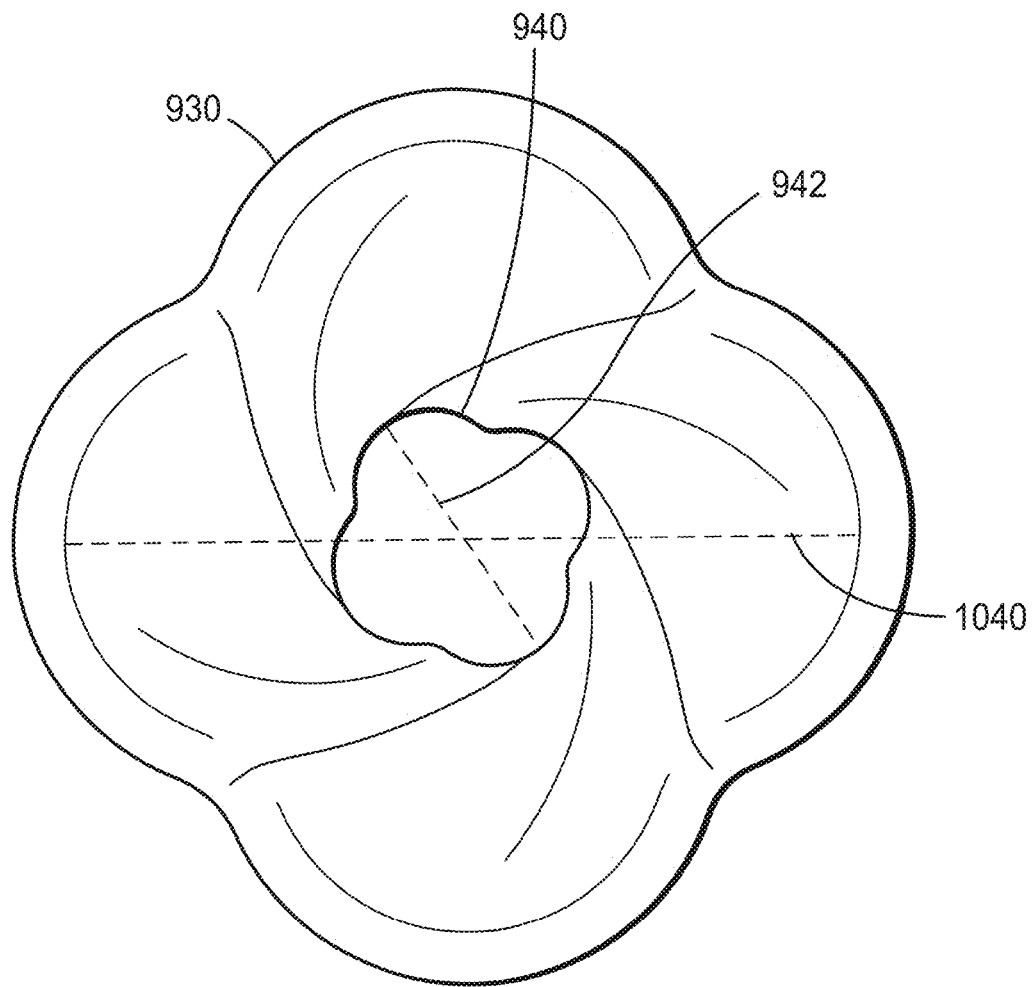
FIG. 11 is a schematic top-view of the microstructure (nozzle hole) shown in FIG. 9.

FIG. 11 is a schematic top-view of nozzle hole (or microstructure) 920 illustrating hole entry 930 having axis of symmetry 1040 and hole exit 940 having axis of symmetry 942. Viewed from the top, the axes of symmetry of the cross-sections of hole 920 rotate counter clockwise from the hole entry to the hole exit. Such a rotation results in a twist in the hole along its height or thickness.

Figure 12:
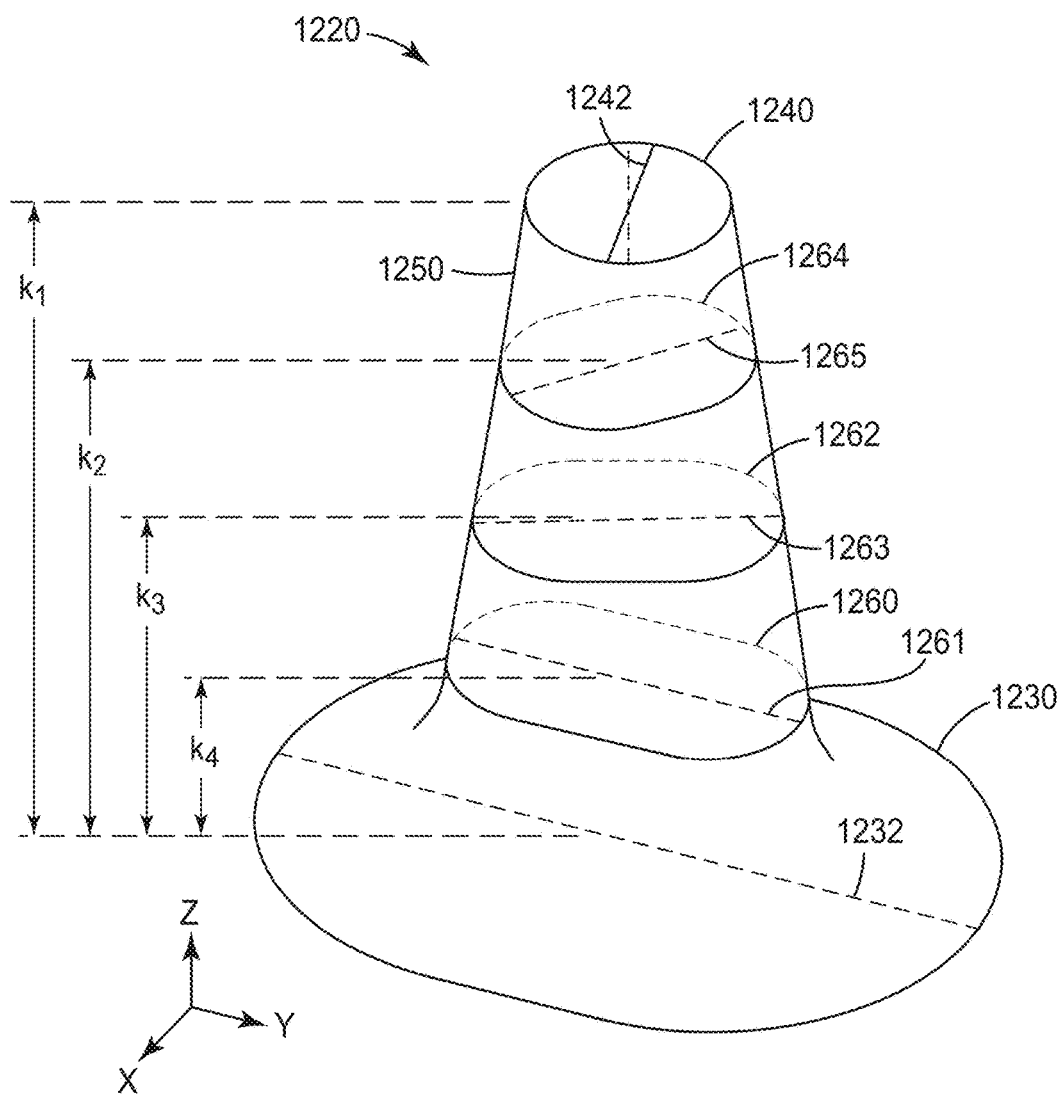
FIG. 12 is a schematic three-dimensional view of a nozzle hole (microstructure)
Figure 13:
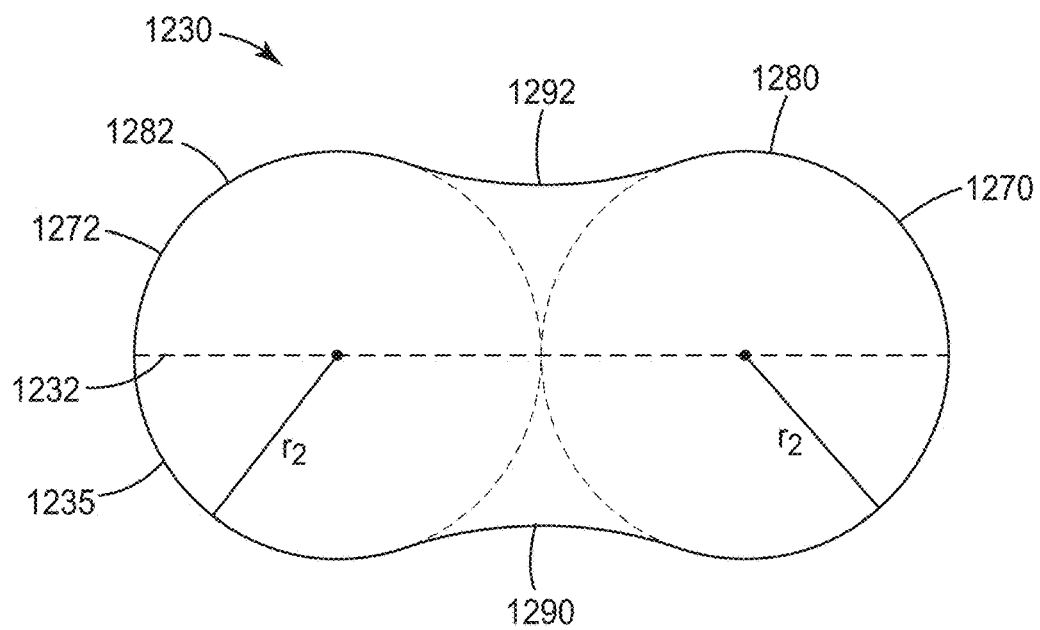
FIG. 13 is a schematic of the hole entry (base) of the nozzle hole (microstructure) shown in FIG. 12.

As another example, FIG. 12 is a schematic three-dimensional view of a nozzle hole (or microstructure) 1220 that has a height $k_1$ and includes a hole entry 1230, a hole exit 1240, and a wall 1250 that extends from the hole entry to the hole exit. FIG. 13 is a schematic of hole entry 1230 having a perimeter 1235 that includes the outer arcs of two closely packed or touching circles, where the outer arcs are connected by curve-like fillets. In particular, perimeter 1090 includes an outer arc 1270 of a circle 1280 and an outer arc 1272 of a circle 1282, where each circle has a radius $r_2$ and outer arcs 1270 and 1272 are connected by curve-like fillets 1290 and 1292.

Figure 14:
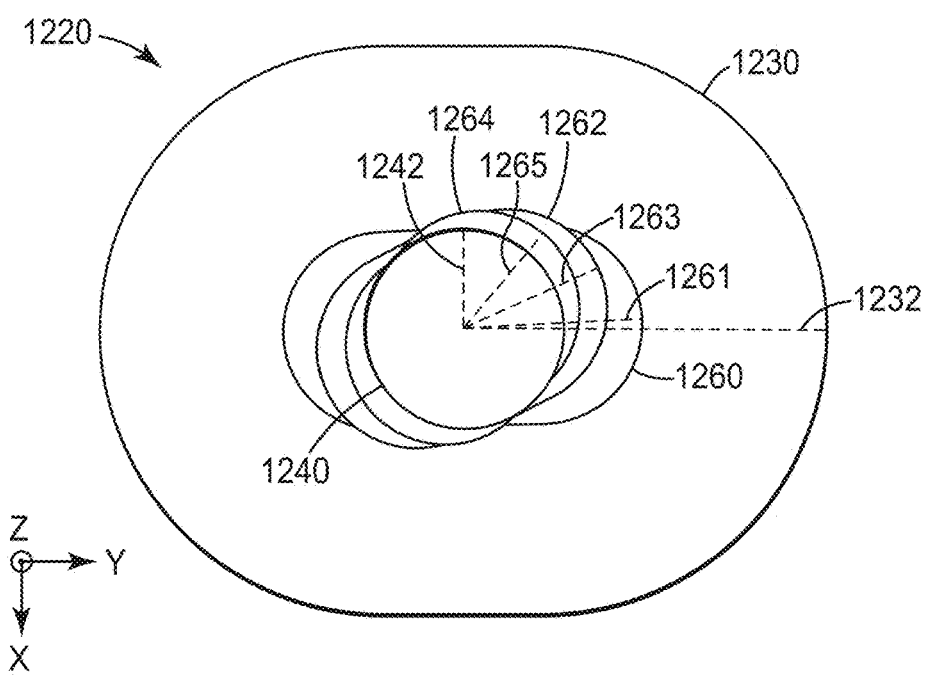
FIG. 14 is a schematic top-view of the nozzle hole (microstructure) shown in FIG. 12.

Hole entry 1230 includes an axis of symmetry 1232. The lateral cross-sections of nozzle hole 1220 rotate and the radius $r_2$ decreases from hole entry 1230 to hole exit 1240 resulting in a microstructure that spirals and tapers narrower from hole entry 1230 to hole exit 1240. In particular, top 1240 has an axis of symmetry 1242 along the x-direction, an xy cross-section 1264 of the hole at a height $k_2<k_1$ has an axis of symmetry 1265 that is rotated clockwise relative to axis of symmetry 1242, an xy cross-section 1262 of the hole at a height $k_3<k_2$ has an axis of symmetry 1263 that is rotated clockwise relative to axis of symmetry 1265, an xy cross-section 1260 of the hole at a height $k_4<k_3$ has an axis of symmetry 1261 that is rotated clockwise relative to axis of symmetry 1263, and hole entry 1230 has an axis of symmetry 1232 along the y-axis that is rotated clockwise relative to axis of symmetry 1261. Hence, hole 1220 has an xy cross-section that rotates clockwise from hole exit 1240 to hole entry 1230. Equivalantly, hole 1220 has an xy cross-section that rotates counter clockwise from the hole entry to the hole exit. FIG. 14 is a schematic top-view of nozzle hole 1220 illustrating hole exit 1242 and its axis of symmetry 1242 along the x-axis, cross-section 1264 and its axis of symmetry 1265, cross-section 1262 and its axis of symmetry 1263, cross-section 1260 and its axis of symmetry 1261, and hole entry 1230 and its axis of symmetry 1232 along the y-axis. Viewed from the top, the axes of symmetry of the lateral cross-sections of the hole rotate clockwise from the hole exit to the hole entry.

Equivalently, a microstructure 1220 includes a base 1230, a top 1240 and a side 1250 that connects the base to the top. Microstructure 1220 has a cross-section that rotates and becomes smaller from the base to the top.

As shown in FIGS. 2 through 14, the microstructures disclosed herein that serve as nozzles may be monolithic structures. In other words, the microstructures 220, 320, 420 etc. that forms the actual nozzles are created from, and ultimately form a common, single piece of material. This may be understood as different from nozzles that are formed through a combination of a number of different parts, where such parts are potentially made up of different materials. In this regard, as shown in the above-mentioned figures, the nozzles disclosed herein may be monolithic structures.

Figure 15A:
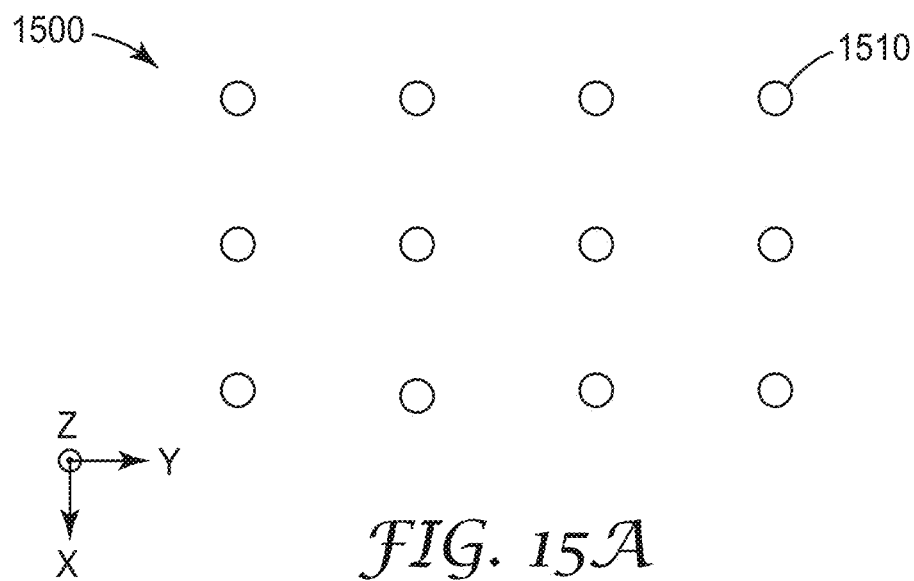
FIGS. 15A and B are schematic top-views of two different arrays of holes (microstructures)
Figure 15B:
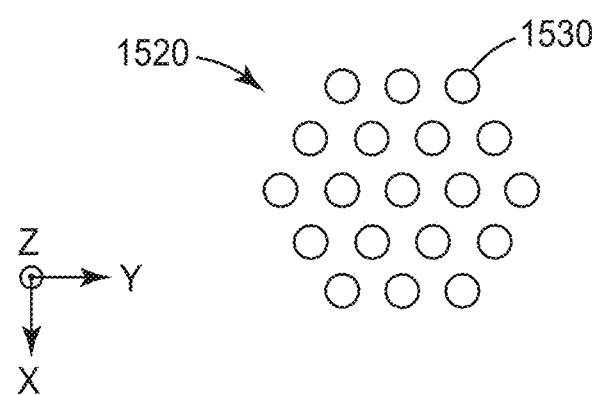
Figure 16:
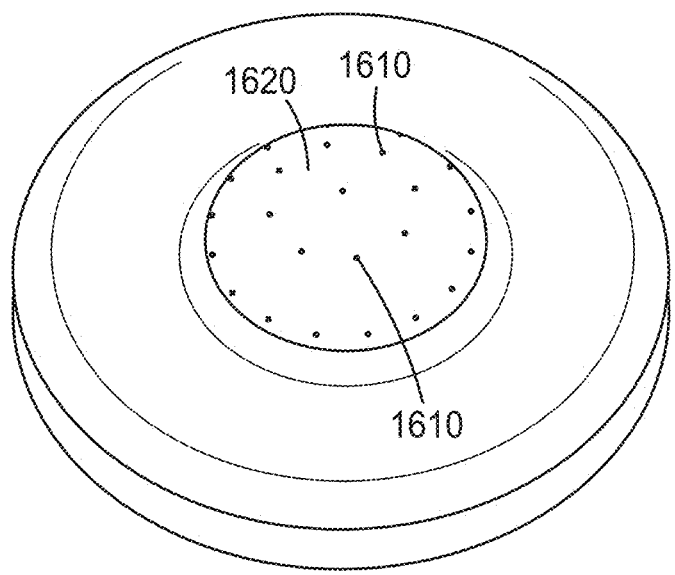
FIG. 16 is a schematic three-dimensional view of a plurality of nozzle holes (microstructures)

In general, a plurality of disclosed microstructures or holes can have any arrangement that may be desirable in an application. For example, in some cases, the disclosed holes can be arranged regularly or irregularly. For example, FIG. 15A is a schematic top-view of a two-dimensional square array 1500 of holes or microstructures 1510, and FIG. 15B is a schematic top-view of a two-dimensional hexagonal array 1520 of holes or microstructures 1530, where holes or microstructures 1510 and 1530 can be any nozzle hole or microstructure disclosed herein. In some cases, a plurality of disclosed microstructures or hole may be arranged on a non-planar surface. For example, FIG. 16 is a schematic three-dimensional view of a plurality of nozzle holes or microstructures 1610 disposed or arranged on a spherical surface 1620.

Figure 17:
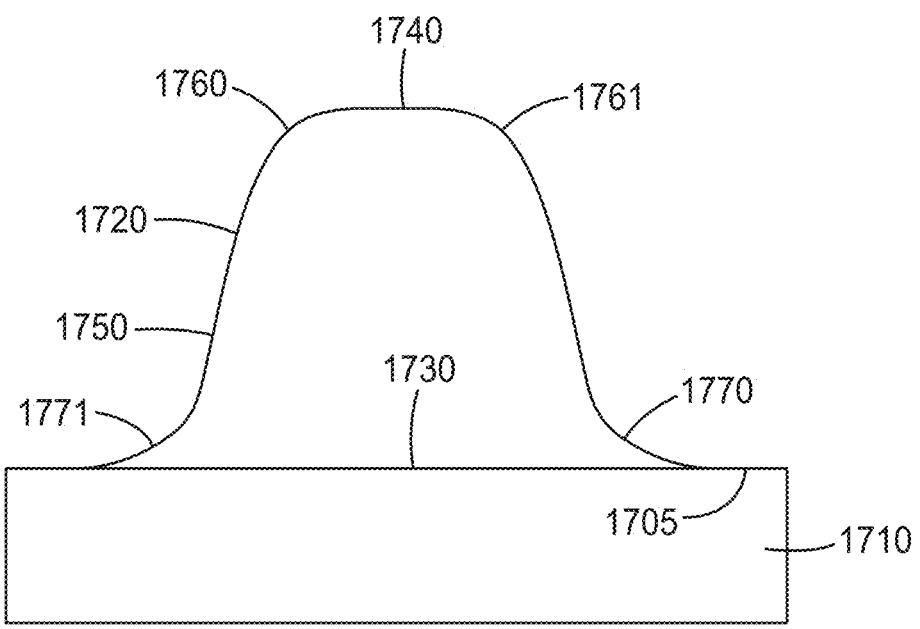
FIG. 17 is a schematic side-view of a microstructure.

In some cases, a disclosed microstructure or hole may have one or more fillets for ease of manufacturing and/or to reduce local stress. For example, FIG. 17 is a schematic side-view of a microstructure 1720 that is disposed on a substrate 1710 and includes a base 1730, a top 1740, and a side 1750 connecting the base to the top. Microstructure 1720 includes fillets 1760 and 1761 smoothly joining side 1750 and top 1740, and fillets 1770 and 1771 smoothly joining side 1750 and top surface 1705 of substrate 1710.

The nozzle holes and microstructures disclosed herein can be fabricated using the method outlined in reference to FIGS. 1A-1M. The method provides flexibility and control in producing a variety of individual microstructures and holes in a single array, yet can be used to achieve desirably low levels of average surface roughness while maintaining industrially acceptable fabrication speeds or "throughput."

FIG. 1A is a schematic side-view of a layer 115 of a first material disposed on a substrate 110. The first material is capable of undergoing multiphoton reaction by simultaneously absorbing multiple photons. For example, in some cases, the first material is capable of undergoing a two photon reaction by simultaneously absorbing two photons. The first material can be any material or material system that is capable of undergoing multiphoton, such as two photon, reaction, such as those describe in U.S. Pat. Nos. 7,583,444 and 7,941,013; and PCT Publication WO 2009/048705, "Highly Functional Multiphoton Curable Reactive Species," all of which are incorporated herein by reference.

In some cases, the first material can be a photoreactive composition that includes at least one reactive species that is capable of undergoing an acid- or radical-initiated chemical reaction, and at least one multiphoton photoinitiator system. Reactive species suitable for use in the photoreactive compositions include both curable and non-curable species. Exemplary curable species include addition-polymerizable monomers and oligomers and addition-crosslinkable polymers (such as free-radically polymerizable or crosslinkable ethylenically-unsaturated species including, for example, acrylates, methacrylates, and certain vinyl compounds such as styrenes), as well as cationically-polymerizable monomers and oligomers and cationically-crosslinkable polymers (which species are most commonly acid-initiated and which include, for example, epoxies, vinyl ethers, cyanate esters, etc.), and the like, and mixtures thereof. Exemplary non-curable species include reactive polymers whose solubility can be increased upon acid- or radical-induced reaction.

Such reactive polymers include, for example, aqueous insoluble polymers bearing ester groups that can be converted by photogenerated acid to aqueous soluble acid groups (for example, poly(4-tert-butoxycarbonyloxystyrene). Non-curable species also include the chemically-amplified photoresists.

The multiphoton photoinitiator system enables polymerization to be confined or limited to the focal region of a focused beam of light used to expose the first material. Such a system preferably is a two- or three-component system that includes at least one multiphoton photosensitizer, at least one photoinitiator (or electron acceptor), and, optionally, at least one electron donor.

Layer 115 of the first material can be coated on substrate 110 using any coating method that may be desirable in an application. For example, the first material can be coated on substrate 110 by flood coating. Other exemplary coating methods include knife coating, notch coating, reverse roll coating, gravure coating, spray coating, bar coating, spin coating and dip coating.

Substrate 110 can be chosen from a wide variety of films, sheets, and other surfaces (including silicon wafers and glass plates), depending upon the particular application and the method of exposure to be utilized. In some cases, substrate 110 is sufficiently flat so that layer 115 of the first material has a uniform thickness. In some cases, layer 115 can be exposed in bulk form. In such cases, substrate 110 may be excluded from the fabrication process. In some cases, such as when the process includes one or more electroplating steps, substrate 110 can be electrically conductive or semi-conductive.

Next, the first material is selectively exposed to an incident light having sufficient intensity to cause simultaneous absorption of multiple photons by the first material in the exposed region. The exposure can be accomplished by any method that is capable of providing light with sufficient intensity. Exemplary exposure methods are described in U.S. Pat. No. 8,858,807, which is incorporated herein by reference.

Figure 18:
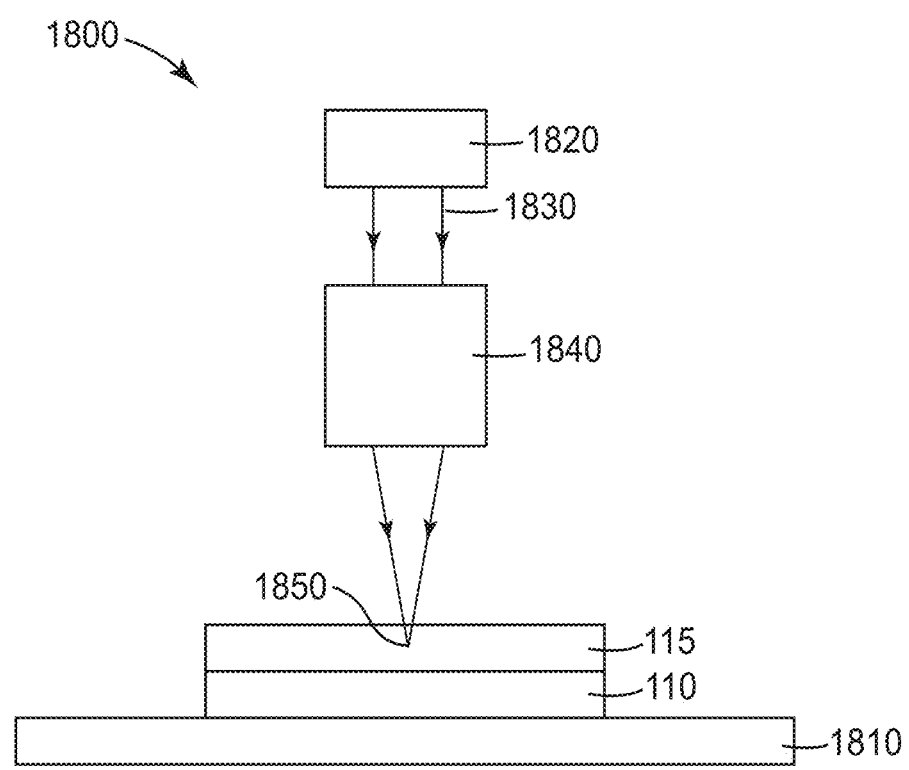
FIG. 18 is a schematic side-view of an exposure system.

FIG. 18 is a schematic side-view of an exemplary exposure system 1800 for exposing layer 115 of the first material. The exposure system includes a light source 1820 emitting light 1830 and a stage 1810 that is capable of moving in one, two, or three dimensions. Substrate 110 coated with layer of first material 115 is placed on the stage. Optical system 1840 focuses emitted light 1830 at a focal region 1850 within the first material. In some cases, optical system 1840 is designed so that simultaneous absorption of multiple photons by the first material occurs only at or very near focal region 1850. Regions of layer 115 that undergo the multiphoton reaction become more, or less, soluble in at least one solvent compared to regions of layer 115 that do not undergo the multiphoton reaction.

Focal region 1850 can scan a three-dimensional pattern within the first material by moving stage 1810 and/or light 1830 and/or one or more components, such as one or more mirrors, in optical system 1840. In the exemplary process illustrated in FIGS. 1A and 18, layer 115 is disposed on a planar substrate 110. In general, substrate 110 can have any shape that may be desirable in an application. For example, in some cases, substrate 110 can have a spherical shape.

Light source 1820 can be any light source that is capable of producing sufficient light intensity to effect multiphoton absorption. Exemplary light sources include lasers, such as femtosecond lasers, operating in a range from about 300 nm to about 1500 nm, or from about 400 nm to about 1100 nm, or from about 600 nm to about 900 nm, or from about 750 to about 850 nm.

Optical system 1840 can include, for example, refractive optical elements (for example, lenses or microlens arrays), reflective optical elements (for example, retroreflectors or focusing mirrors), diffractive optical elements (for example, gratings, phase masks, and holograms), polarizing optical elements (for example, linear polarizers and waveplates), dispersive optical elements (for example, prisms and gratings), diffusers, Pockels cells, waveguides, and the like. Such optical elements are useful for focusing, beam delivery, beam/mode shaping, pulse shaping, and pulse timing.

Figure 1B:
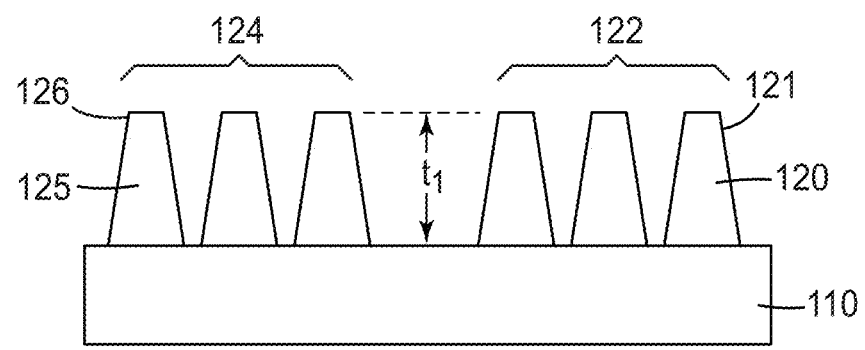

After selective exposure of layer 115 of the first material by exposure system 1800, the exposed layer is placed in a solvent to dissolve regions of higher solvent solubility. Exemplary solvents that can be used for developing the exposed first material include aqueous solvents such as, for example, water (for example, having a pH in a range of from 1 to 12) and miscible blends of water with organic solvents (for example, methanol, ethanol, propanol, acetone, acetonitrile, dimethylformamide, N-methylpyrrolidone, and the like, and mixtures thereof); and organic solvents. Exemplary useful organic solvents include alcohols (for example, methanol, ethanol, and propanol), ketones (for example, acetone, cyclopentanone, and methyl ethyl ketone), aromatics (for example, toluene), halocarbons (for example, methylene chloride and chloroform), nitriles (for example, acetonitrile), esters (for example, ethyl acetate and propylene glycol methyl ether acetate), ethers (for example, diethyl ether and tetrahydrofuran), amides (for example, N-methylpyrrolidone), and the like, and mixtures thereof. FIG. 1B is a schematic side-view of a first microstructured pattern 121 formed in the first material using the multiphoton process. The first microstructured pattern includes a first cluster 122 of microstructures 120 and a second cluster 124 of microstructures 125, where microstructures 120 and 125 can be any microstructures including any microstructures disclosed herein. In some cases, microstructures 120 and 125 have different structures. In some cases, microstructures 120 and 125 have the same structure. In the exemplary first microstructured pattern 121, microstructures 120 and 125 have heights $t_1$.

Figure 19:
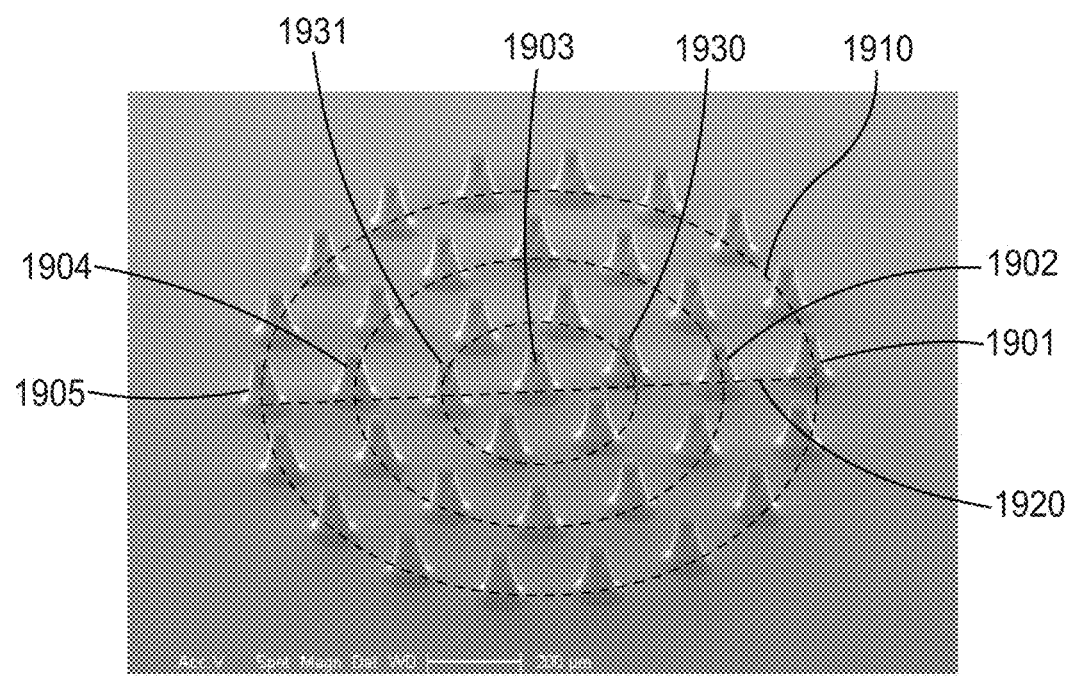
FIGS. 19 and 20 are two scanning electron micrographs (SEM) of a cluster of microstructures.
Figure 20:
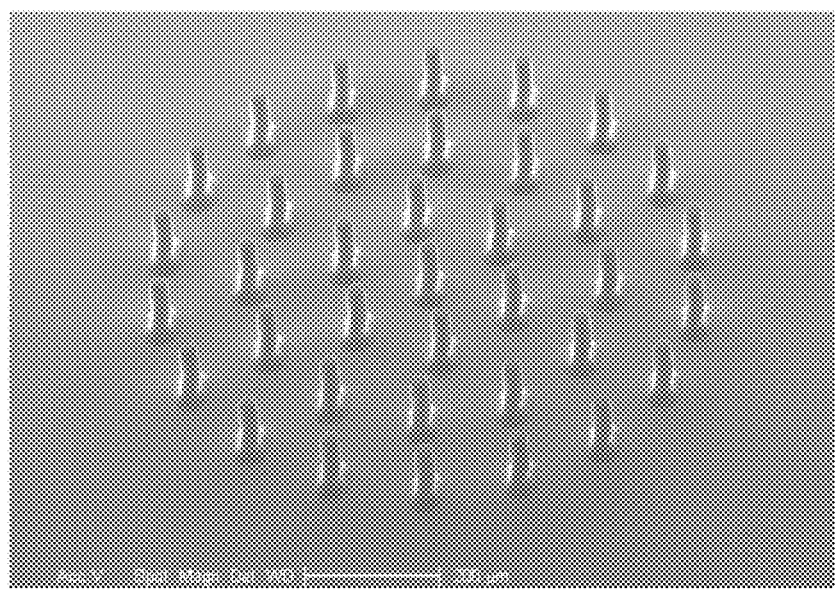

FIGS. 19 and 20 are scanning electron micrographs of a cluster of microstructures 120 fabricated according to the processes disclosed herein. The microstructures in FIGS. 19 and 20 are similar to microstructures 1220 shown in FIG. 12. In FIG. 19, the microstructures are viewed along the minor axes of the bases of the microstructures and in FIG. 20, the microstructures are viewed along the major axes of the bases of the microstructures.

The plurality of microstructures in FIG. 19 (and FIG. 20) are arranged in an array of concentric circles that includes an outermost circle 1910. The microstructures are arranged such that no diameter of the outermost circle includes at lease one discrete microstructure from each circle in the array of concentric circles. For example, a diameter 1920 of outermost circle 1910 includes microstructures 1901-1905 but not microstructures 1930 and 1931. Each circle in the array of concentric circles in FIG. 19 includes equally spaced discrete microstructures. Similarly, in some cases, a nozzle includes a plurality of holes that are arranged in an array of concentric circles that includes an outermost circle. The discrete nozzle holes are arranged such that no diameter of the outermost circle includes at lease one discrete nozzle hole from each circle in the array of concentric circles. In some cases, each circle in the array of concentric circles comprises equally spaced discrete nozzle holes.

Figure 1C:
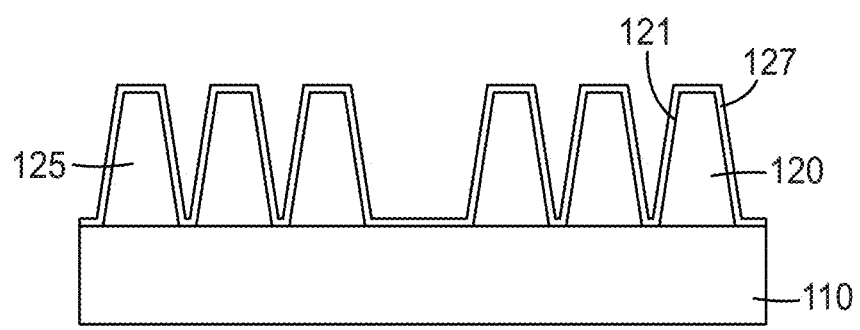

Next, as schematically illustrated in FIG. 1C, top surface 126 of first microstructured pattern 121 is metalized or made electrically conductive by coating the top surface with a thin electrically conductive seed layer 127. Conductive seed layer 127 can include any electrically conductive material that is desirable in an application. Exemplary conductive materials include silver, chromium, gold and titanium. In some cases, seed layer 127 has a thickness that is less than about 50 nm, or less than about 40 nm, or less than about 30 nm, or less than about 20 nm.

Figure 1D:
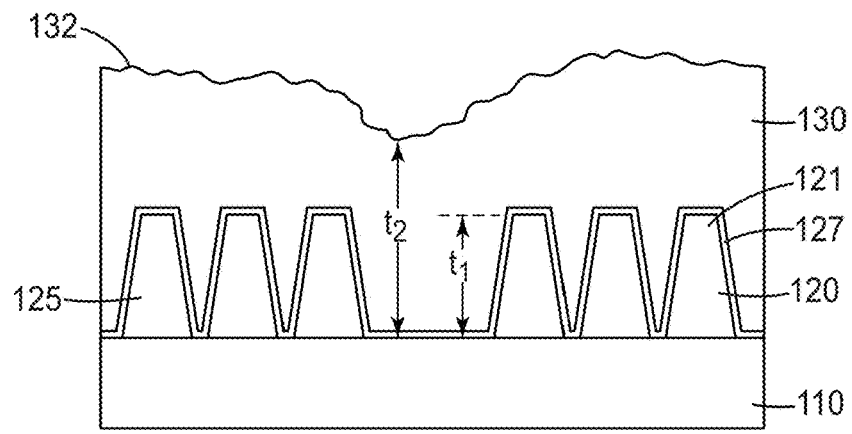
Figure 1E:
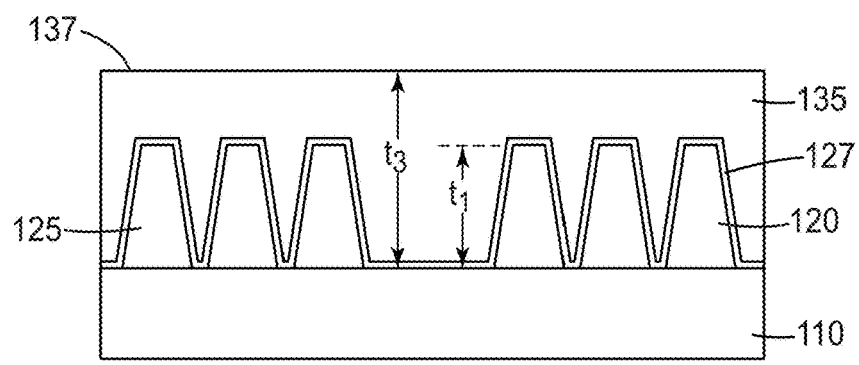

Next, as schematically illustrated in FIG. 1D, seed layer 127 is used to electroplate first microstructured pattern 121 with a second material resulting in a layer 130 of the second material. In some cases, the electroplating of first microstructured pattern 121 is continued until the minimum thickness $t_2$ of layer 130 is greater than $t_1$.

Suitable second materials for electroplating include silver, passivated silver, gold, rhodium, aluminum, enhanced reflectivity aluminum, copper, indium, nickel, chromium, tin, and alloys thereof.

In some cases, layer 130 of the second material has an uneven or rough top surface 132. In such cases, layer 130 of the second material is polished or ground resulting in a layer 135 of the second material having a thickness $t_3 > t_1$ as illustrated schematically in FIG. 1E. The grinding or polishing can be accomplished using any grinding method that may be desirable in an application. Exemplary grinding methods include surface grinding and mechanical milling.

In some cases, layer of second material 130 can be directly deposited on first microstructured pattern 121 without first coating pattern 121 with seed layer 127. In such cases, layer 130 can be coated on pattern 121 by any using suitable method including, for example, sputtering and chemical vapor deposition.

Figure 1F:
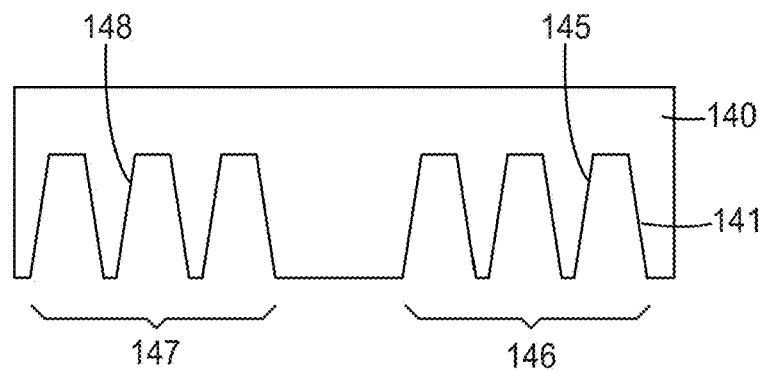

Next, substrate 110 and the first material are removed resulting in a first mold 140 of the second material shown schematically in FIG. 1F. For ease of viewing and without loss of generality, seed layer 127 is not shown in FIG. 1F. In some cases, substrate 110 and the patterned first material can be separated from layer 135 by hand. In some cases, the separation can be carried out prior to grinding layer 130.

First mold 140 includes a second microstructured pattern 141 that is substantially the negative replica of first microstructured pattern 121. In particular, first mold 140 of the second material includes a first cluster 146 of microstructures 145 and a second cluster 147 of microstructures 148, where microstructures 145 are substantially negative replicas of microstructures 120 and microstructures 148 are substantially negative replicas of microstructures 125.

Figure 1G:
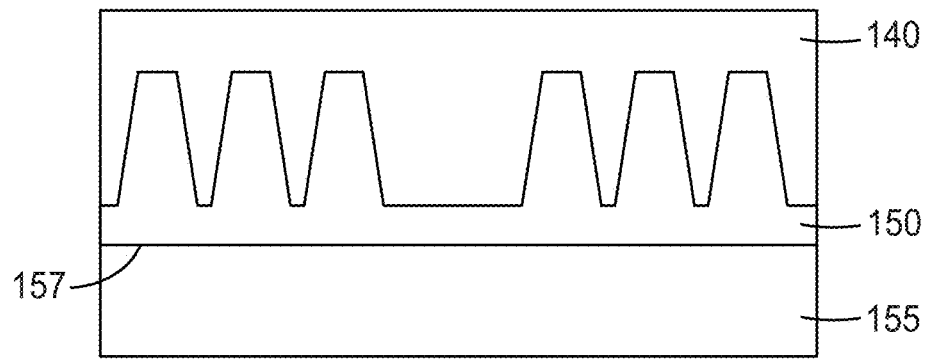

Next, the second microstructured pattern is replicated in a third material 150 different than the first and second materials by disposing the third material in between first mold 140 of the second material and a substrate 155 having a smooth top surface 157 as schematically illustrated in FIG. 1G. The replication process can be accomplished using any suitable replication method. For example, in some cases, the replication can be accomplished by using an injection molding process. In such cases, a molten third material 150 can be introduced between substrate 155 and first mold 140 and solidified after the molten third material fills the second microstructured pattern. The third material 150 can be any material that is capable of replicating a pattern. Exemplary third materials include polycarbonate and other thermoplastics such as polystyrene, acrylic, styrene acrylonitrile, poly- methyl methacrylate (PMMA), cyclo olefin polymer, polyethylene terephthalate, polyethylene 2,6-naphthalate, and fluoropolymers.

Figure 21:
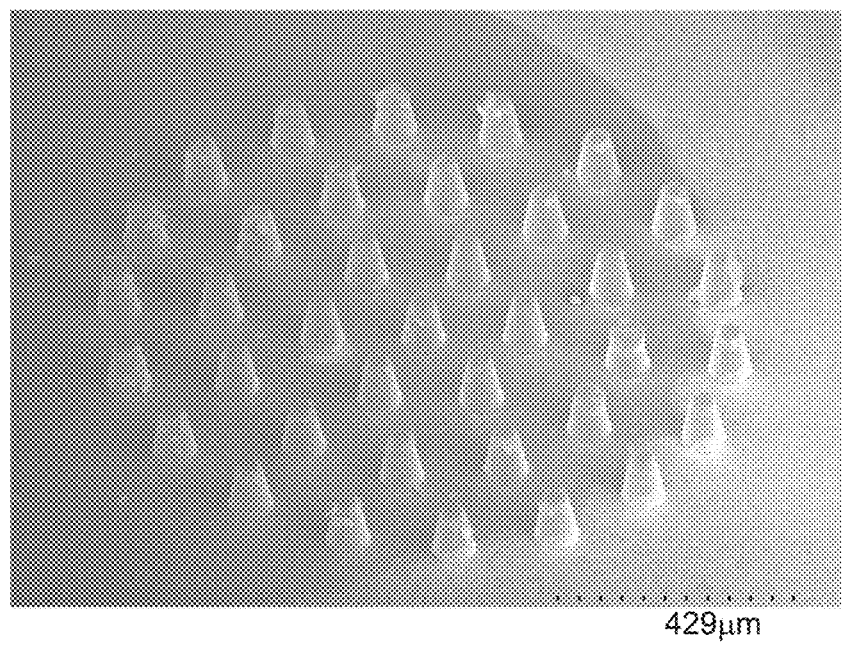
FIG. 21 is an SEM of a cluster of polycarbonate microstructures.

After the replication process, first mold 140 of the second material and substrate 155 are removed resulting in a second mold 160 of the third material having a substrate portion 162 and a third microstructured pattern 161 that is substantially the negative replica of second microstructured pattern 141 and substantially a positive replica of first microstructured pattern 121. Third microstructured pattern 161 includes a first cluster 168 of microstructures 165 and a second cluster 169 of microstructures 159, where microstructures 165 are substantially negative replicas of microstructures 145 and microstructures 159 are substantially negative replicas of microstructures 148. In some cases, microstructures 165 are substantially positive replicas of microstructures 120 and microstructures 159 are substantially positive replicas of microstructures 125. FIG. 21 is a scanning electron micrograph of a cluster of polycarbonate microstructures 165 fabricated according to the processes disclosed herein.

Figure 1H:
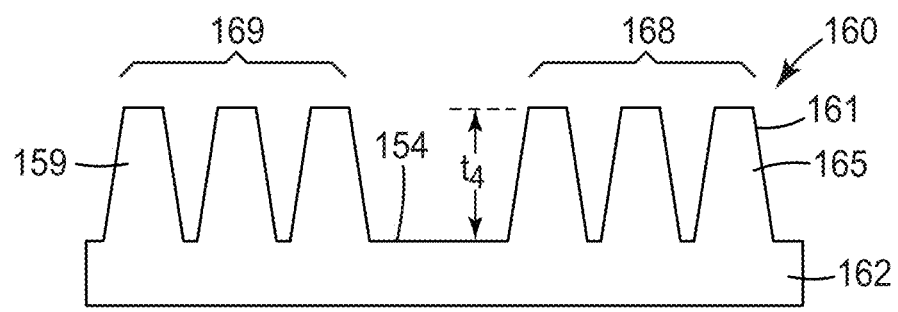
Figure 1I:
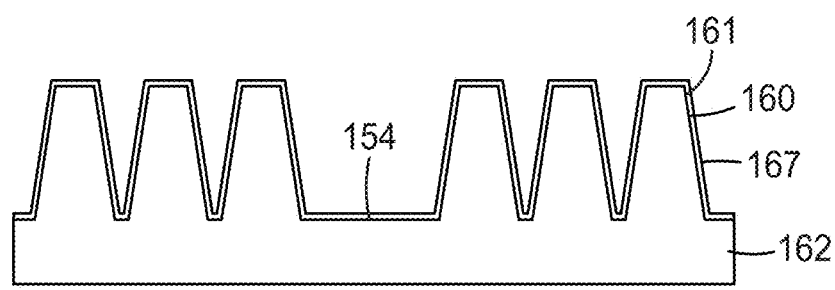

Next, as schematically illustrated in FIG. 1I, top surface 154 of third microstructured pattern 161 is metalized or made electrically conductive by coating the top surface with a thin electrically conductive seed layer 167 similar to seed layer 127.

Figure 1J:
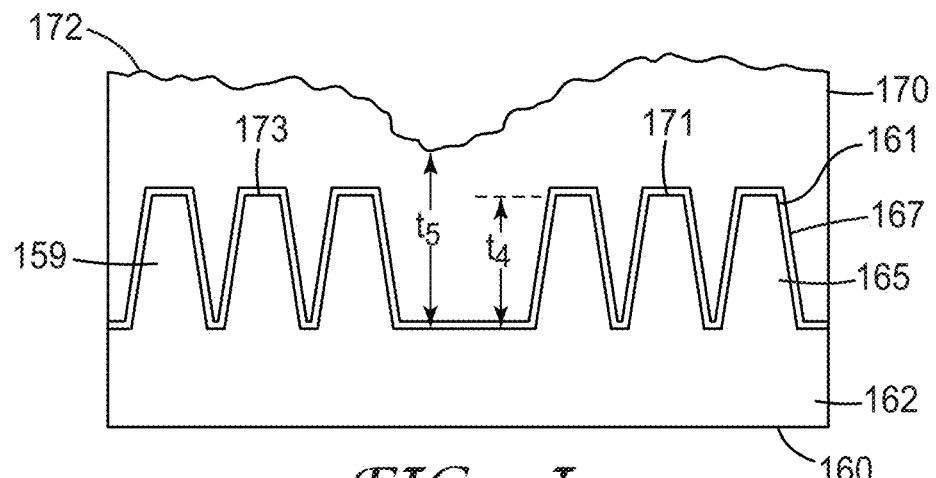

Next, as schematically illustrated in FIG. 1J, seed layer 167 is used to electroplate third microstructured pattern 161 with a fourth material different than the third material resulting in a layer 170 of the fourth material. In some cases, the electroplating of second microstructured pattern 161 is continued until the minimum thickness $t_2$ of layer 130 is greater than $t_4$, the height of the microstructures in second mold 160. In some cases, height $t_4$ is substantially equal to height $t_1$. Suitable fourth materials for electroplating include silver, passivated silver, gold, rhodium, aluminum, enhanced reflectivity aluminum, copper, indium, nickel, chromium, tin, and alloys thereof. In other embodiments, the fourth material may be a ceramic that is deposited on third microstructured pattern. Such a ceramic material may be formed, e.g., by a sol-gel process as described in commonly owned and assigned U.S. Pat. No. 5,453,104, or by photocuring of a ceramic-filled or pre-ceramic polymeric composition as described in commonly owned and assigned U.S. Pat. Nos. 6,572,693, 6,387,981, 6,899,948, 7,393,882, 7,297,374, and 7,582,685, each of which is herein incorporated by reference in its entirety. Such ceramic materials may comprise, e.g., silica, zirconia, alumina, titania, or oxides of yttrium, strontium, barium, hafnium, niobium, tantalum, tungsten, bismuth, molybdenum, tin, zinc, lanthanide elements (i.e. elements having atomic numbers ranging from 57 to 71, inclusive), cerium and combinations thereof.

Figure 1K:
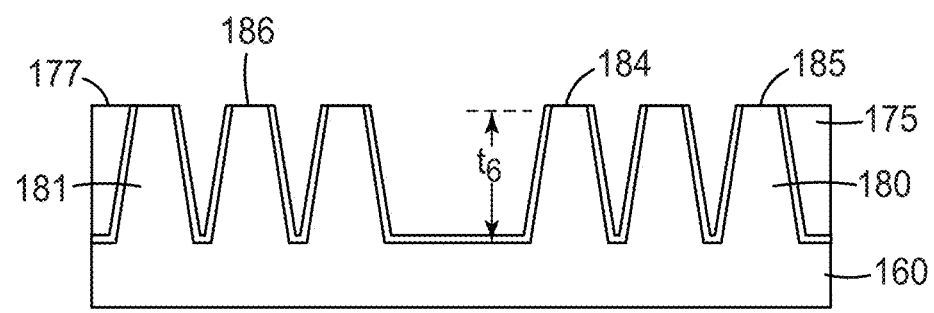
Figure 1L:
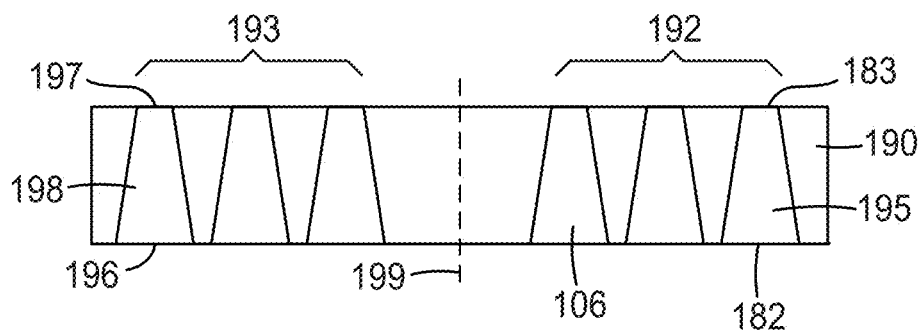

Next, top surface of 172 of layer 170 is ground until tops 171 of microstructures 165 and tops 173 of microstructures 159 are exposed. In some cases, the third material is softer than the fourth material. For example, in some cases, the third material is polycarbonate and the fourth material is a nickel alloy. In such cases, small portions of tops 171 and 173 can be removed during the grinding process to ensure that the tops of all the microstructures in third microstructured pattern 161 are exposed. In such cases, the grinding results, as schematically illustrated in FIG. 1K, in a layer 175 of the fourth material planarizing the third microstructured pattern and exposing tops 185 of the microstructures in the plurality of microstructures in the third microstructured pattern. Layer 175 of the fourth material has a top surface 177 that is substantially even with tops 184 of microstructures 180 and tops 186 of microstructures 181. The microstructures have a height $t_6$ that can be slightly less than $t_4$.

Next, second mold 160 is removed resulting in a layer 190 of the fourth material that includes a plurality of holes 106 that correspond to the plurality of microstructures in third microstructured pattern 161. In particular, layer 190 of the fourth material includes a first cluster 192 of holes 195 and a second cluster 193 of holes 198. In some cases, holes 195 are substantial replicas of microstructures 120 and holes 198 are substantial replicas of microstructures 125. Holes 195 include hole entries 182 and hole exits 183 and holes 198 include hole entries 196 and hole exits 197.

Figure 22:
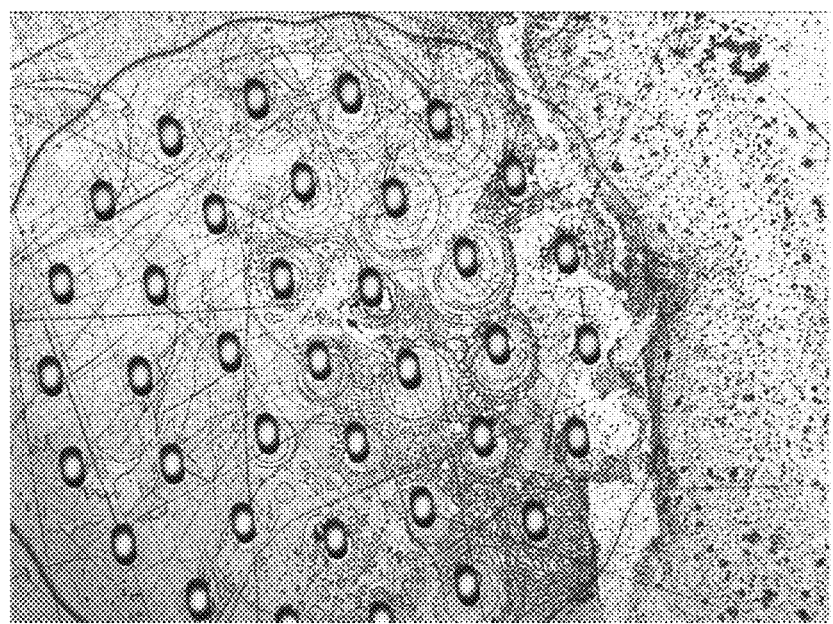
FIGS. 22 and 23 are optical micrographs of respective hole entries and hole entries of a cluster of holes.
Figure 23:
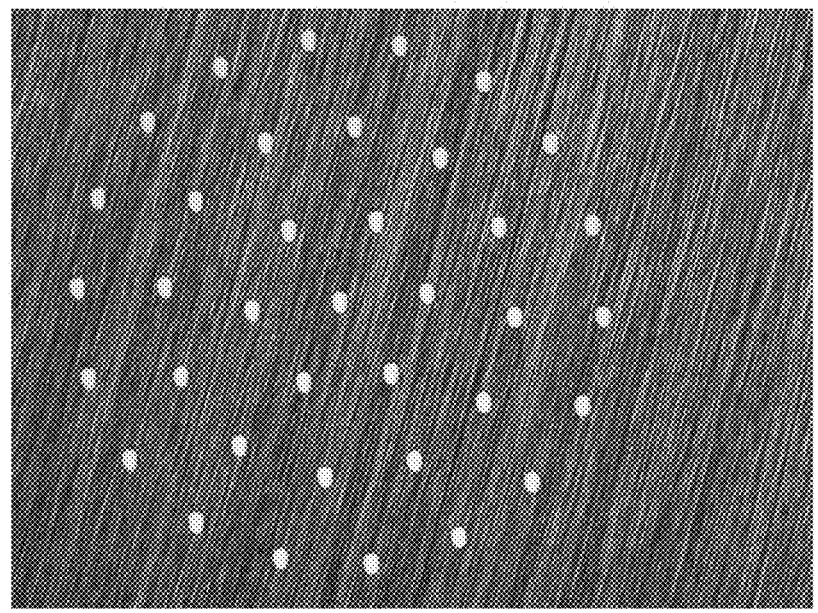
Figure 25:
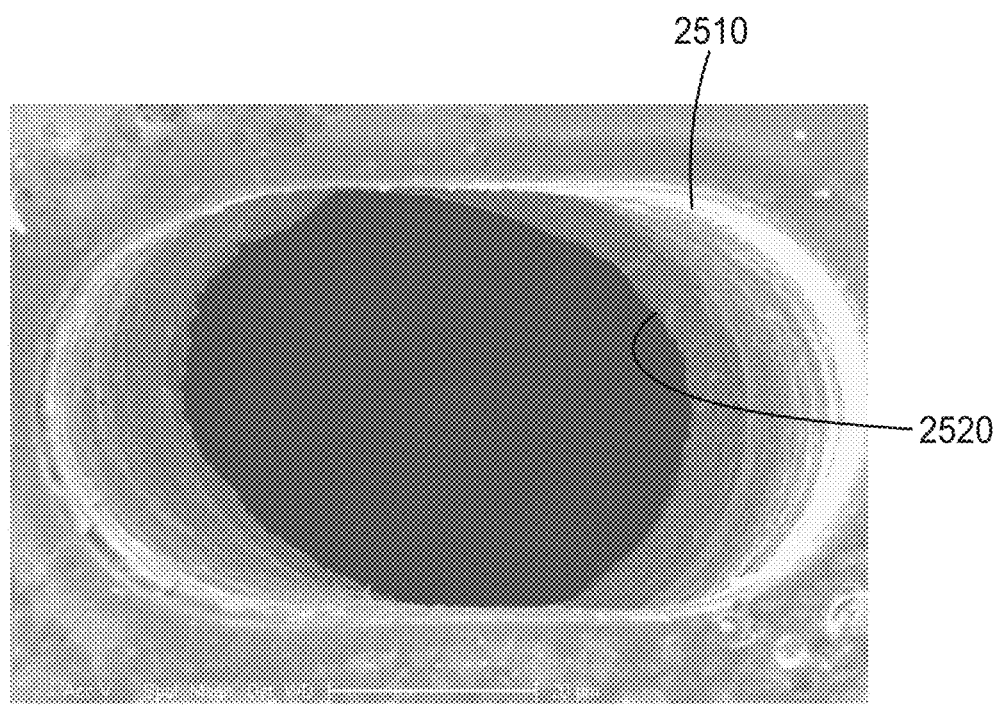
FIG. 25 is an SEM of one of the holes shown in FIGS. 22 and 23.

FIGS. 22 and 23 are optical micrographs of respective hole entries 182 and hole exits 183 of a cluster 192 of holes 195 made according to the processes disclosed herein. FIG. 25 is a scanning electron micrograph of one of the holes 195, viewed from the hole entry side. The hole has a hole entry 2510 and a hole exit 2520 that is smaller than the hole entry. The micrograph clearly illustrates a taper and a twist in the hole.

Figure 1M:
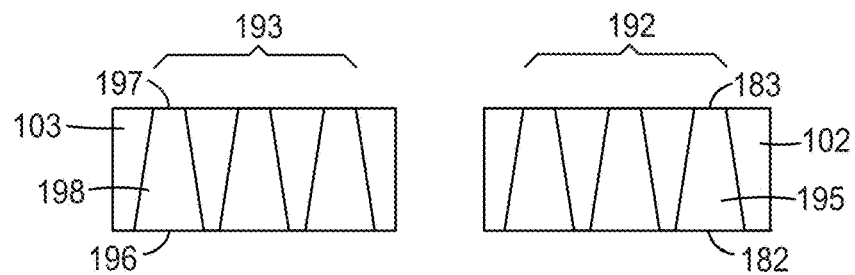

In some cases, two clusters 192 and 193 are separated along a direction 199 resulting, as illustrated schematically in FIG. 1M, in a part 102 and a separate, and in some cases substantially identical, part 103, where each part can be used in a spray nozzle and/or a fuel injector.

Figure 24:
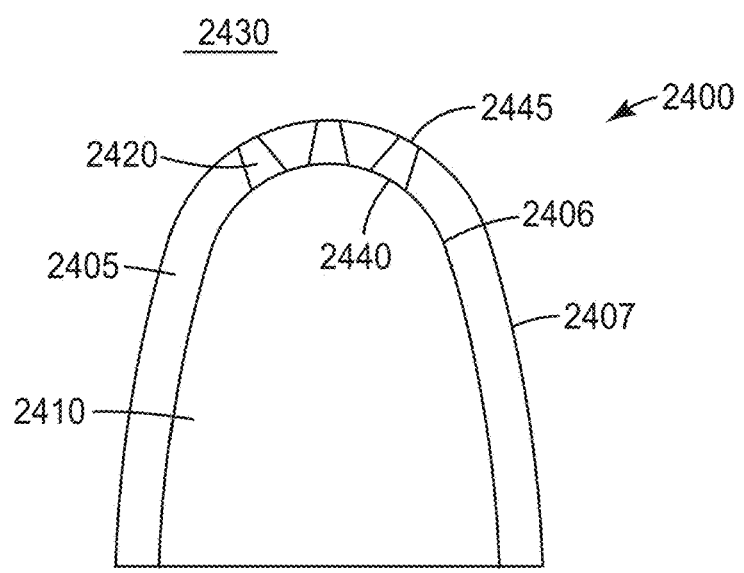
FIG. 24 is a schematic side-view of a nozzle.

FIG. 24 is a schematic side-view of a nozzle 2400 that includes a hollow interior 2410 and a wall 2405 separating the hollow interior from an outside 2430 of the nozzle. The nozzle further includes at least one hole, such as a hole 2420, that connects hollow interior 2410 to outside 2430 of the nozzle. The holes deliver gas or liquid from the hollow interior to the outside. Hole 2420 can be any hole disclosed herein. Hole 2420 includes a hole entry 2440 at an inner surface 2406 of wall 2405 and a hole exit 2445 at an outside surface 2407 of wall 2405. Hole entry 2440 is also at hollow interior 2410 of the nozzle and hole exit 2445 is at outside 2430 of the nozzle.

In some cases, hole entry 2440 has a first shape and hole exit 2445 has a second shape that is different than the first shape. For example, in some cases, the first shape is an elliptical shape and the second shape is a circular shape. As another example, in some cases, the first shape can be a racetrack shape and the second shape can be a circular shape. As another example, in some cases, the second shape can be a circle or an ellipse and the perimeter of the first shape can include outer arcs of a plurality of closely packed circles, where the outer arcs are connected to each other by curve-like fillets.

In some cases the first shape can be substantially the same as the second shape, but they can have different magnifications or sizes. For example, the first shape can be a circle with a radius $a_1$ and the second shape can also be a circle, but with a radius $a_2$ different than $a_1$.

In some cases, hole 2420 has a lateral cross-section that rotates from hole entry 2440 to hole exit 2445 where lateral cross-section refers to a cross-section that is substantially perpendicular to the general flow direction of, for example, a liquid or gas within the hole. In some cases, the cross-section has an increasing rotation rate from the hole entry to the hole exit. In some cases, the cross-section has a decreasing rotation rate from the hole entry to the hole exit. In some cases, the cross-section has a constant rotation rate from the hole entry to the hole exit.

Some of the advantages of microstructures, holes, layers, constructions, and methods of this invention are further illustrated by the following example. The particular materials, amounts and dimensions recited in the example, as well as other conditions and details, should not be construed to unduly limit this invention. Unless otherwise noted, all chemical procedures were carried out under a dry nitrogen atmosphere with dry and deoxygenated solvents and reagents. Unless otherwise noted, all solvents and reagents were or can be obtained from Aldrich Chemical Co., Milwaukee, Wis.

Rhodamine B hexafluoroantimonate was prepared by metathesis of Rhodamine B chloride with sodium hexafluoroantimonate. As used herein, SR368 refers to tris-(2-hydroxyethyl)isocyanurate triacrylate, (obtained from Sartomer Co. Inc., Exton, Pa.; SR9008 refers to a trifunctional acrylate ester (obtained from Sartomer); SR1012 refers to diaryliodonium hexafluoroantimonate (obtained from Sartomer); SU-8 R2150 refers to an epoxy negative photoresist (obtained from MicroChem Corp., Newton, Mass.); THF refers to tetrahydrofuran; LEXAN HPS1R refers to a thermoplastic polycarbonate (obtained from Sabic Innovative Plastics, Pittsfield, Mass.; and Inco S-Rounds refers to nickel (obtained from Vale Inco America's, Inc., Saddle Brook, N.J.).

Example 1

A circular silicon wafer (substrate 110 in FIG. 1A), 10.2 cm in diameter, was obtained from Wafer World, Inc., West Palm Beach, Fla. The Si wafer was cleaned by soaking it for approximately ten minutes in a 3:1 mixture by volume of concentrated sulfuric acid and 30% by weight aqueous hydrogen peroxide. The wafer was then rinsed with deionized water and then with isopropanol, after which it was dried under a stream of air. The wafer was then dipped into a two weight percent solution of 3-(trimethoxysilyl)propyl methacrylate in 190-proof ethanol that had been made acidic (pH between 4 and 5) with acetic acid. The wafer was then rinsed with absolute ethanol and was then heated in an oven at 130° C. for ten minutes.

Poly(methyl methacrylate), having a number average molecular weight of approximately 120,000, SR9008, and SR368 were combined in a weight ratio of 30:35:35 resulting in a monomer mixture that was dissolved in sufficient 1,2-dichloroethane to afford a solution that was 54 weight percent of the monomer mixture. To this solution there were then added aliquots of concentrated solutions of photosensitizer Rhodamine B hexafluoroantimonate in THF and SR1012 in THF sufficient to give a coating solution that was 0.5 weight percent Rhodamine B hexafluoroantimonate and 1.0 weight percent SR1012, based on the total weight of solids. This coating solution was filtered through a 1-micron syringe filter and was spin-coated onto the silicon wafer. The coated wafer was placed in a forced air oven at 60° C. for 18 hours to afford a coated silicon wafer with a substantially solvent-free (hereinafter, "dry") coating (layer 115 of the first material in FIG. 1A) having a thickness of approximately 300 μm.

Two-photon polymerization of the dry coating was carried out using a diode-pumped Ti:sapphire laser (obtained from Spectra-Physics, Mountain View, Calif.) that operated at 800 nm with a nominal pulse width of 80 fs, a pulse repetition rate of 80 MHz, and an average power of approximately 1 W. The coated wafer was placed on a computer-controlled three-axis stage (obtained from Aerotech, Inc., Pittsburgh, Pa.). The laser beam was attenuated by neutral density filters and was focused into the dry coating using a galvoscanner with a telescope for x-, y-, and z-axis control (available from Nutfield Technology, Inc., Windham, N.H.). A Nikon CFI Plan Achromat 50× oil objective N.A. 0.90 with a working distance of 0.400 mm and a 4.0 mm focal length was applied directly onto the surface of the dry coating. The average power was measured at the output of the objective lens using a wavelength-calibrated photodiode (obtained from Ophir Optronics, Ltd., Wilmington, Mass.) and was determined to be approximately 8 mW.

After the exposure scan was completed, the exposed dry coating was developed in MicroChem SU-8 solvent, rinsed and dried resulting in a first microstructured pattern 121 (FIG. 1b).

The surface of the first microstructured pattern was made conductive by sputtering a thin layer (about 100 angstroms) of Silver (Ag) on the surface of the pattern. The metalized front surface was then electroplated with Inco S-Rounds (nickel) until it was approximately 2 mm thick. The electroplated nickel slug was then separated from the first pattern and ground and machined resulting in a first mold 140 having a second microstructured pattern 141 (FIG. 1F).

The first mold was then placed into an injection die mold which was placed into a single screw plastic injection molding system to inject thermoplastic polycarbonate (LEXAN HPS1R) into the mold cavity resulting in a second mold 160 having a third microstructured pattern 161 (FIG. 1H).

The front surface of the second mold was then metalized by sputtering the surface with about 100 angstroms of silver. The metalized second mold was then electroplated with Inco S-Rounds (nickel) to totally cover the third microstructured pattern resulting in a nickel layer 170 (FIG. 1J).

After rinsing the combined construction of the nickel layer and the second mold with deionized water, the front surface 172 (FIG. 1J) of the nickel layer was ground in a planar fashion to remove the nickel material from the tops 171 of the third microstructured pattern.

After the grinding was complete (all the microstructure tops were exposed), the electroplated nickel layer was separated from the polycarbonate mold 160 resulting in a nickel disc, approximately 8 mm in diameter and 160 um thick having 37 through-holes arranged in a circular hexagonal packing arrangement. The separation between neighboring holes was about 200 µm. Each hole had a hole entry in the shape of a racetrack modified with fillets along the linear portions of the racetrack. The racetrack had a major diameter of about 80 µm and a minor diameter of about 50 µm. Each hole had a hole exit in the shape of a smaller racetrack with a major diameter of about 50 µm and a minor diameter of about 35 µm. Viewed from the hole exit side, the major diameters of the cross-section of the holes rotated clockwise from the hole exit to the hole entry by about 30 degrees for every 50 µm of depth below the hole exit.

As used herein, terms such as "vertical", "horizontal", "above", "below", "left", "right", "upper" and "lower", "clockwise" and "counter clockwise" and other similar terms, refer to relative positions as shown in the figures. In general, a physical embodiment can have a different orientation, and in that case, the terms are intended to refer to relative positions modified to the actual orientation of the device. For example, even if the image in FIG. 1B is flipped as compared to the orientation in the figure, surface 126 is still considered to be the top surface.

All patents, patent applications, and other publications cited above are incorporated by reference into this document as if reproduced in full. While specific examples of the invention are described in detail above to facilitate explanation of various aspects of the invention, it should be understood that the intention is not to limit the invention to the specifics of the examples. Rather, the intention is to cover all modifications, embodiments, and alternatives falling within the spirit and scope of the invention as defined by the appended claims.

What is claimed is:

1. A method of fabricating a fuel injector nozzle comprising a plurality of through-holes, said method comprising the steps of:
   forming a first microstructured pattern in a polymerizable material capable of undergoing a photon reaction by selectively reacting the polymerizable material using a photon process, where the photon process enables polymerization to be confined or limited to the focal region of a focused beam of light used to expose the polymerizable material, with the first microstructured pattern comprising a plurality of microstructures, and each microstructure being a negative replica of a fuel injector nozzle through-hole and comprising a top;
   replicating at least the microstructures of the first microstructured pattern in a metal material to make a replicated structure, with the replicated structure comprising a second microstructured pattern, the second microstructure pattern comprising a negative replica of the microstructures, and the top of each microstructure being either covered with the metal material or exposed;
   for each microstructure having its top covered with the metal material, removing metal material from the replicated structure to expose the top of each microstructure covered with the metal material; and
   removing at least the microstructures from the replicated structure, resulting in a nozzle having a plurality of through-holes.

2. The method of claim 1, wherein the top of at least one of the microstructures is covered with the metal material.

3. The method of claim 2, wherein said removing comprises planarizing metal material of the replicated structure to expose tops of the microstructures.

4. The method of claim 2, wherein said removing metal material from the replicated structure results in a fuel injector nozzle having a plurality of through-holes.

5. The method of claim 1, wherein replicating the first microstructured pattern in the metal material comprises electroplating the first microstructured pattern.

6. The method of claim 1, wherein the second microstructured pattern is a pattern of holes, with each hole only having a hole entry.

7. The method of claim 1, wherein replicating the first microstructured pattern in the metal material comprises coating the first microstructured pattern with the metal material.

8. The method of claim 1, wherein each through-hole has a hole wall connecting a hole entry to a hole exit, and the hole wall of at least one through-hole has a side that is continuously curved from its hole entry to its hole exit.

9. The method of claim 1, wherein each through-hole has a hole wall connecting a hole entry to a hole exit, the hole entry and the hole exit each define an opening area, and the opening area of the hole entry of at least one through-hole is larger than the opening area of its hole exit.

10. The method of claim 1, wherein each through-hole has a hole wall connecting a hole entry to a hole exit, and the hole wall of at least one through-hole has a lateral cross-sectional area that becomes smaller from the hole entry to the hole exit of the through-hole.

11. The method of claim 1, wherein each through-hole has a hole wall connecting a hole entry to a hole exit, and for at least one through-hole, the hole entry has a first shape and the hole exit has a second shape different than the first shape.

12. The method of claim 1, wherein each through-hole has a hole wall connecting a hole entry to a hole exit, each of the through-holes has a central axis passing through the center of the through-hole from the hole entry to the hole exit, and the hole wall of at least one through-hole has a side that curves with a convex or concave shape from its hole entry to its hole exit.

* * * * *

UNITED STATES PATENT AND TRADEMARK OFFICE
CERTIFICATE OF CORRECTION

PATENT NO. : 10,539,106 B2
APPLICATION NO. : 15/099122
DATED : January 21, 2020
INVENTOR(S) : Carpenter et al.

Page 1 of 1

It is certified that error appears in the above-identified patent and that said Letters Patent is hereby corrected as shown below:

In the Specification

Column 2, Line 66, delete "at lease" and insert -- at least --, therefor.

Column 4, Line 32, delete "(Ibarak$_1$," and insert -- (Ibaraki, --, therefor.

Column 7, Line 49, delete "Equivalantly," and insert -- Equivalently, --, therefor.

Column 10, Lines 56-57, delete "at lease" and insert -- at least --, therefor.

Column 10, Line 66, delete "at lease" and insert -- at least --, therefor.

Column 12, Line 32, delete "t$_2$" and insert -- t$_5$ --, therefor.

Signed and Sealed this
Tenth Day of March, 2020

Andrei Iancu
*Director of the United States Patent and Trademark Office*